(12) United States Patent
Lee et al.

(10) Patent No.: US 9,177,965 B2
(45) Date of Patent: Nov. 3, 2015

(54) NONVOLATILE MEMORY DEVICE IN THREE-DIMENSIONAL STRUCTURE WITH A STRESS REDUCING MATERIALS ON THE CHANNEL

(75) Inventors: Changhyun Lee, Suwon-si (KR);
Sung-Il Chang, Hwaseong-si (KR);
Byoungkeun Son, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/279,708

(22) Filed: Oct. 24, 2011

(65) Prior Publication Data

US 2012/0104484 A1    May 3, 2012

(30) Foreign Application Priority Data

Oct. 29, 2010  (KR) .................. 10-2010-0106961

(51) Int. Cl.
*H01L 29/792*  (2006.01)
*H01L 27/115*  (2006.01)
*H01L 45/00*  (2006.01)

(52) U.S. Cl.
CPC ........ *H01L 27/11582* (2013.01); *H01L 29/792* (2013.01); *H01L 45/1233* (2013.01); *H01L 45/1253* (2013.01)

(58) Field of Classification Search
USPC .................. 257/315, 324, E29.309, E21.209, 257/E21.423, E21.662, E27.103, E21.645, 257/E21.68, E21.21, E27.098
See application file for complete search history.

(56) References Cited

U.S. PATENT DOCUMENTS

| 2008/0102586 | A1* | 5/2008 | Park .............................. 438/290 |
| 2009/0023280 | A1* | 1/2009 | Ang et al. ..................... 438/594 |
| 2009/0117707 | A1* | 5/2009 | Shimomura et al. .......... 438/458 |
| 2009/0121271 | A1* | 5/2009 | Son et al. ...................... 257/315 |
| 2009/0242966 | A1* | 10/2009 | Son et al. ...................... 257/324 |
| 2010/0181610 | A1* | 7/2010 | Kim et al. ..................... 257/314 |
| 2010/0276743 | A1* | 11/2010 | Kuniya et al. ................ 257/315 |

FOREIGN PATENT DOCUMENTS

| JP | 06-338602 | 12/1994 |
| JP | 2009-117843 | 5/2009 |
| KR | 10-2009-0047614 A | 5/2009 |
| KR | 10-2009-0113606 A | 11/2009 |

* cited by examiner

*Primary Examiner* — Khaja Ahmad
(74) *Attorney, Agent, or Firm* — Lee & Morse, P.C.

(57) ABSTRACT

A nonvolatile memory device includes a substrate, a stacked structure with conductive materials and first insulating materials and the conductive materials and the first insulating materials are alternately stacked on the substrate, and a plurality of pillars in contact with the substrate and the pillars extend through the stacked structure in a direction perpendicular to the substrate. The device also includes information storage layers between the conductive materials and the first insulating materials, and second insulating materials between the first insulating materials and the pillars.

10 Claims, 36 Drawing Sheets

NONVOLATILE MEMORY DEVICE IN THREE-DIMENSIONAL STRUCTURE WITH A STRESS REDUCING MATERIALS ON THE CHANNEL

CROSS-REFERENCE TO RELATED APPLICATIONS

This US non-provisional patent application claims priority under 35 USC §119 to Korean Patent Application No. 10-2010-0106961, filed on Oct. 29, 2010, in the Korean Intellectual Property Office, and entitled "Nonvolatile Memory Device and Manufacturing Method Thereof," is incorporated by reference herein in its entirety.

BACKGROUND

A semiconductor memory device may be a memory device that is implemented with semiconductor materials such as silicon (Si), germanium (Ge), gallium arsenide (GaAs), and/or indium phosphide (InP). Semiconductor memory devices may be one of a volatile memory device and a nonvolatile memory device.

The volatile memory device may be a memory device in which stored data may be erased when a power source is shut off. Examples of volatile memory devices include Static Random Access Memory (SRAM), Dynamic Random Access Memory (DRAM), and Synchronous Dynamic Random Access Memory (SDRAM). A nonvolatile memory device may be a memory device that retains stored data even when a power source is shut off Examples of nonvolatile memory devices include Read-Only Memory (ROM), Programmable Read Only Memory (PROM), Erasable Programmable Read Only Memory (EPROM), Electrical Erasable Programmable Read Only Memory (EEPROM), flash memory devices, Phase-change Random Access Memory (PRAM), Magnetoresistive Random Access Memory (MRAM), Resistive Random Access Memory (RRAM) and Ferroelectric Random Access Memory (FRAM). Flash memory devices may be largely categorized into a NOR type and a NAND type.

Semiconductor memory devices having a three-dimensional structure have been studied to increase integration of semiconductor devices.

SUMMARY

Embodiments may be realized by providing a nonvolatile memory device including a substrate, a stacked structure including conductive materials and first insulating materials and the conductive materials and the first insulating materials are alternately stacked on the substrate, a plurality of pillars in contact with the substrate and the pillars extend through the stacked structure in a direction perpendicular to the substrate, information storage layers between the conductive materials and the first insulating materials, and second insulating materials between the first insulating materials and the pillars.

The first insulating materials may include a semiconductor nitride. The second insulating materials may include a semiconductor oxide. The information storage layers may extend onto top and bottom surfaces of the conductive materials from between the conductive materials and the pillars. Each of the pillars may include a semiconductor layer.

The information storage layers may include first semiconductor oxide layers on outer side surfaces of the pillars, charge trapping layers on outer side surfaces of the first semiconductor oxide layers, and second semiconductor oxide layers extending onto top and bottom surfaces of the conductive materials from between the conductive materials and the charge trapping layers.

Embodiments may also be realized by providing a nonvolatile memory device including a substrate, a stacked structure including conductive materials and insulating materials, the conductive materials and the insulating materials are alternately stacked on the substrate, and the insulating materials include a semiconductor nitride. The device also includes a plurality of pillars in contact with the substrate and the pillars extend through the stacked structure in a direction perpendicular to the substrate, first semiconductor oxide layers on outer side surfaces of the pillars, charge trapping layers on outer side surfaces of the first semiconductor oxide layers, and second semiconductor oxide layers extending onto top and bottom surfaces of the conductive materials from between the conductive materials and the charge trapping layers.

Each of the pillars may include a semiconductor layer. The insulating materials may be in direct contact with the charge trapping layers.

Embodiments may also be realized by providing a stacked structure on a substrate, the stacked structure includes conductive materials and first insulating materials alternately stacked on the substrate, and the first insulating materials include a semiconductor nitride, a plurality of pillars in contact with the substrate and the pillars extend through the stacked structure in a direction perpendicular to the substrate, charge trapping layers between the conductive materials and the first insulating materials, and semiconductor oxide layers contacting the pillars.

Portions of the semiconductor oxide layers contacting the pillars may be between the first insulating materials and the pillars. The semiconductor oxide layers may be on the charge trapping layers such that the portions of the semiconductor oxide layers contacting the pillars may be between the charge trapping layers and the pillars. The semiconductor oxide layers may extend along substantially an entire length of outer walls of the pillars.

The semiconductor oxide layers may be between the conductive materials and the pillars. The device may include tunnel insulating layers on the charge trapping layers and the tunnel insulating layers may be in contact with the semiconductor oxide layers. Ones of the semiconductor oxide layers contacting one of the plurality of pillars may be spaced apart by adjacent ones of the first insulating materials.

Each pillar may include inner materials and a channel layer surrounding the inner materials and the channel layer may include a semiconductor material. The semiconductor oxide layers may be in contact with the semiconductor material of the channel layer. Each channel layer may include a lower channel layer and an upper channel layer. The lower channel layer may be directly on the substrate and the upper channel layer may be above the lower channel layer and connected to the substrate through the lower channel layer. The lower and upper channel layers of each channel layer may have ones of the semiconductor oxide layers in contact therewith.

The device may include bitlines connected to the plurality of pillars. The semiconductor oxide layers may spaced apart from the first insulating materials by at least the charge trapping layers.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
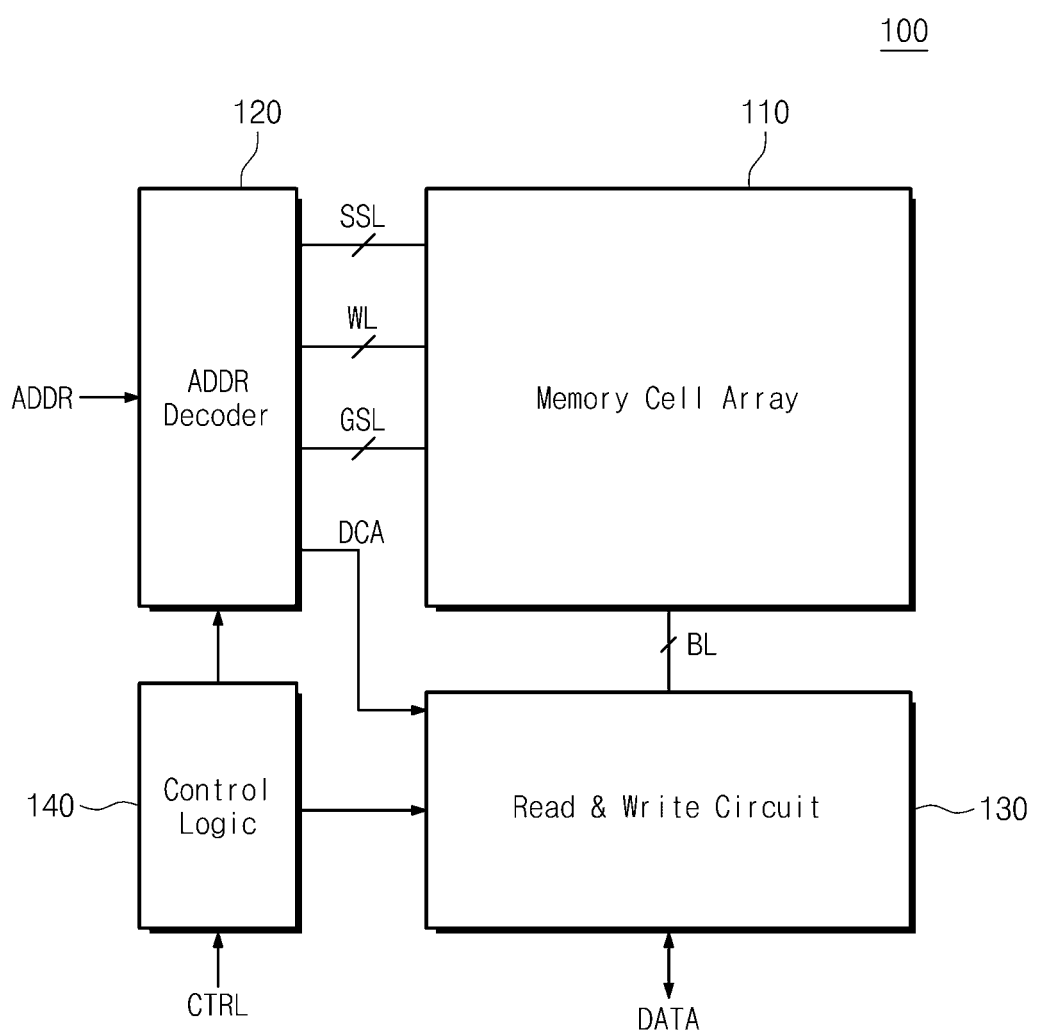
FIG. 1 illustrates a block diagram of a nonvolatile memory device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a block diagram of a nonvolatile memory device 100 according to an exemplary embodiment. As illustrated, the nonvolatile memory device 100 may include a memory cell array 110, an address decoder 120, a read and write circuit 130, and a control logic 140.

The memory cell array 110 may include a plurality of memory cell groups therein. For example, the memory cell array 110 may include a plurality of cell strings arranged on a substrate in the directions of rows and columns. Each of the cell strings may include a plurality of memory cells stacked in a direction intersecting, e.g., substantially perpendicular, to a substrate. For example, the memory cells may be provided on the substrate along rows and columns and stacked in the direction perpendicular to the substrate to constitute a three-dimensional structure. Exemplarily, the memory cell array 110 may include a plurality of memory cells capable of storing one or more bits in each cell.

The address decoder 120 may be connected to the memory cell array 110 through, e.g., wordlines WL, string selection lines SSL, and ground selection lines GSL. The address decoder 120 may be configured to operate in compliance with the control of the control logic 140. The address decoder 120 may receive an external address ADDR.

The address decoder 120 may be configured to decode a row address of received address ADDR. The address decoder 120 may be configured to select a wordline corresponding to the decoded row address among the wordlines WL. The address decoder 120 may be configured to select a string selection line SSL and a ground selection line corresponding to the decoded row address among the string selection lines SSL and the ground selection lines GSL.

The address decoder 120 may be configured to decode a column address of the received address ADDR. The address decoder 120 may transfer the decoded column address DCA to the read and write circuit 130.

According to an exemplary embodiment, the address decoder 120 may include a row decoder decoding a row address, a column decoder decoding a column address, and an address buffer storing the received address ADDR.

The read and write circuit 130 may be connected to the memory cell array 110 through the bitlines BL. The read and write circuit 130 may be configured to exchange data with an external entity. The read and write circuit 130 may operate in compliance with the control of the control logic 140.

The read and write circuit 130 may receive the decoded column address DCA from the address decoder 120. The read and write circuit 130 may select bitlines BL in response to the decoded column address DCA.

The read and write circuit 130 may be configured to externally receive data DATA and writes the received data DATA into the memory cell array 110, according to an exemplary embodiment. The read and write circuit 130 may read the written data DATA from the memory cell array 110 and outputs the read data DATA to an external entity. The read and write circuit 130 may read data from a first storage region of the memory cell array 110 and write the read data in a second storage region of the memory cell array 110. For example, the read and write circuit 130 may perform a copy-back operation.

The read and write circuit 130 may include well-known elements such as a page buffer (or page register) and a column selection circuit. As another example, the read and write circuit 130 may include well-known elements such as a sense amplifier, a write driver, and a column selection circuit.

The control logic 140 may be connected to the address decoder 120 and the read and write circuit 130. For example, the control logic 140 may be configured to control the overall operation of the nonvolatile memory device 100.

Figure 2:
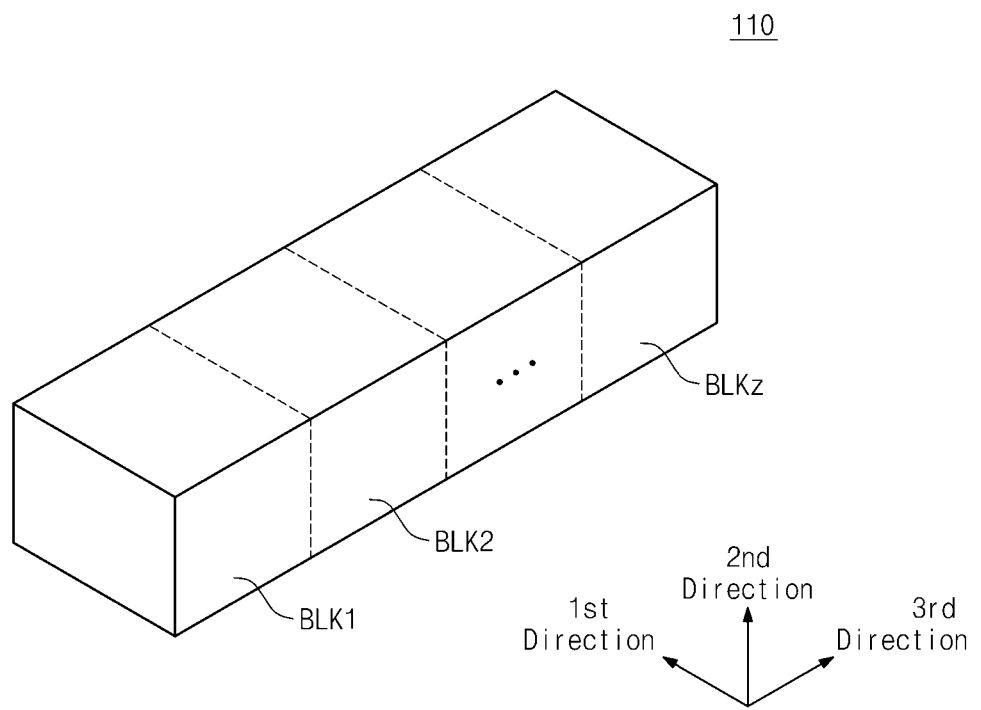
FIG. 2 illustrates memory blocks of a memory cell array in FIG. 1.

FIG. 2 illustrates memory blocks of the memory cell array 110 in FIG. 1. As illustrated, the memory cell array 110 may include a plurality of memory blocks BLK1-BLKz. Each memory block BLK may have a three-dimensional structure, e.g., a vertical structure. For example, each of the memory blocks BLK1-BLKz may include structures extending in each of the first to third directions. For example, each of the memory block BLK1-BLKz may include a plurality of cell strings extending in the second direction. The plurality of cell strings may be provided in the first and third directions to be spaced apart form each other at specific intervals.

The memory blocks BLK1-BLKz may be selected by the address decoder 120 illustrated in FIG. 1. For example, the address decoder 120 may be configured to select at least one memory block BLK corresponding to the received address ADDR of the memory blocks BLK1-BLKz.

Figure 3:
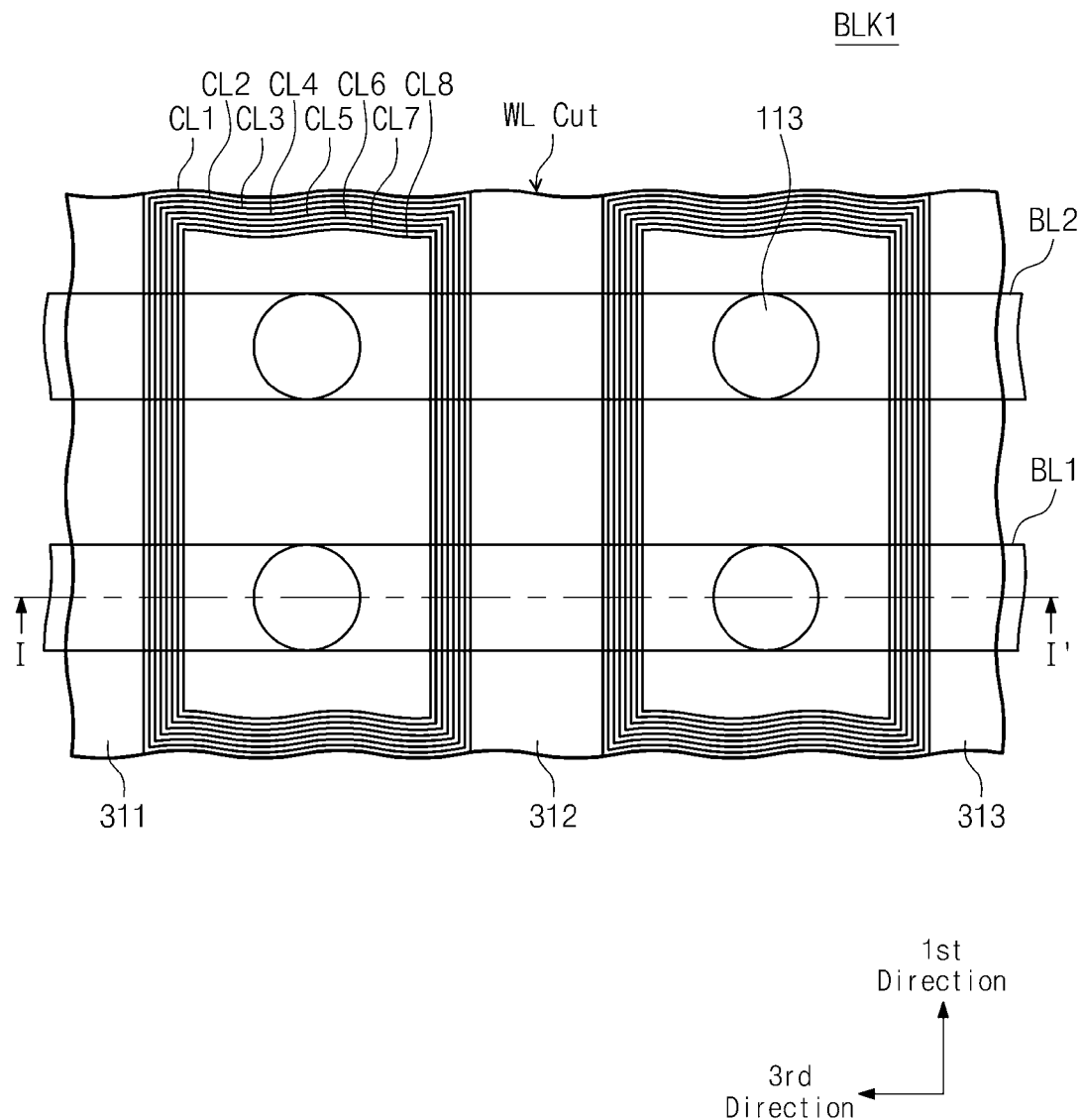
FIG. 3 illustrates a top plan view showing a portion of one of the memory blocks in FIG. 2.
Figure 4:
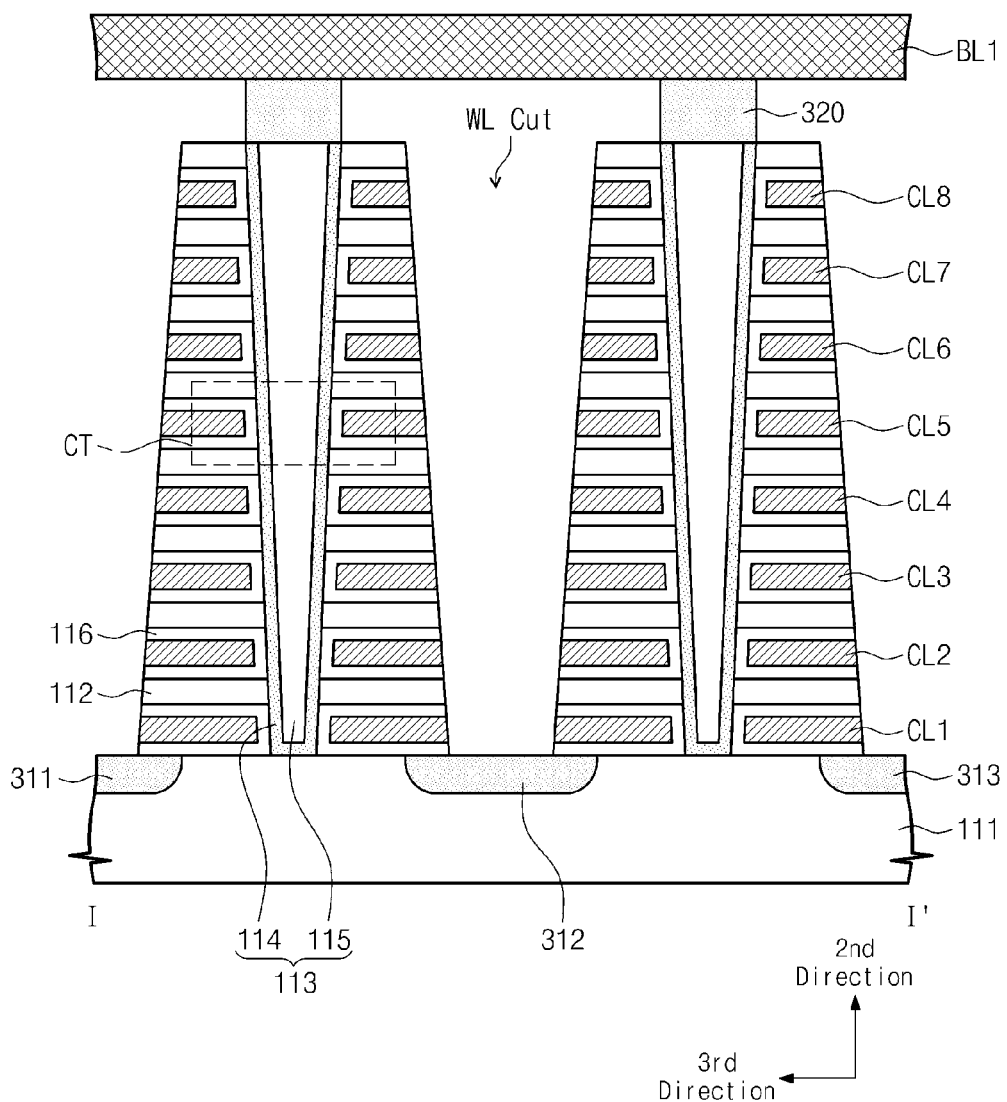
FIG. 4 illustrates an exemplary embodiment of a cross sectional view taken along the line I-I' in FIG. 3.

FIG. 3 illustrates a top plan view showing a portion of one memory block BLK1 among the memory blocks BLK1-BLKz in FIG. 2. Exemplarily, a top plan view of conductive layers of the memory block BLK1 is shown in FIG. 3. Others of the memory blocks BLK may have a similar or substantially a same top plan view. FIG. 4 illustrates an exemplary embodiment of a cross sectional view taken along the line I-I' in FIG. 3.

Referring to FIGS. 3 and 4, the memory block BLK1 may include structures extending in the first to third directions. A substrate 111 may be provided. The substrate 111 may be, e.g., a well having a first conductivity type. For example, the substrate 111 may be a p-type well formed by implanting Group III elements such as boron (B) therein. However, embodiments are not limited thereto. For example, the substrate 111 may be a p-type pocket well provided in an n-type well. Hereinafter, for ease of explanation the substrate 111 is referenced as including a p-type well (or pocket p-well). However, the conductivity type of the substrate 111 is not limited to the p-type well.

A plurality of doping regions 311-313 may be provided on the substrate 111. The doping regions 311-313 may extend in a first direction, e.g., may extend in the first direction substantially parallel to each other. The doping regions 311-313 may be arranged on the substrate 111 in a third direction to be spaced apart from each other at specific intervals. The doping regions 311-313 may be sequentially defined as a first doping region 311, a second doping region 312, and a third doping region 313.

The doping regions 311-313 may have a second conductivity type differing from that of the substrate 111. For example, the first to third doping regions 311-313 may have a n-type conductivity. For ease of explanation, the first to third doping regions 311-313 are referenced as including the n-type conductivity. However, the conductivity types of each of the first to third doping regions 311-313 is not limited to the n-type.

Between adjacent two doping regions among the first to third doping regions 311-313, a plurality of first insulating materials 112 may be sequentially provided on the substrate 111. The plurality of first insulating materials 112 may be stacked in the second direction (e.g., a direction perpendicular to the substrate 111). A stacked structure may include the first insulating materials 112 spaced apart from each other in the second direction at specific intervals. The first insulating material 112 may extend in the first direction e.g., in a direction substantially parallel to the substrate 111. The first insulating materials 112 may include an insulating material such as a nitride, e.g., a semiconductor nitride.

Between adjacent doping regions among the first to third doping regions 311-313, pillars 113 may be arranged in the first direction to penetrate the first insulating materials 112 in the second direction. For example, the pillars 113 may be in contact with the substrate 111 through the first insulating materials 112.

Each of the pillars 113 may include a plurality of materials, according to an exemplary embodiment. For example, a channel layer 114 of each pillar 113 may include a first-type semiconductor material (e.g., silicon). The channel layer 114 of each pillar 113 may include a semiconductor material (e.g., silicon) having the same conductivity type as the substrate 111. Hereinafter, for ease of explanation it is referenced that the channel layer 114 of each pillar 113 includes p-type silicon. However, the channel layer 114 of each pillar 113 is not limited to including the p-type silicon. For example, the channel layer 114 of each pillar 113 may include an intrinsic semiconductor having no conductivity type.

An inner material 115 of each pillar 113 may include an insulating material. For example, the inner material 115 of each pillar 113 may include an insulating material such as silicon oxide. The inner material 115 of each pillar 113 may include an air gap therein.

Between adjacent doping regions among the first to third doping regions 311-313, an information storage layer 116 may be arranged on exposed surfaces of the first insulating materials 112 and the pillars 113. According to an exemplary embodiment, a thickness of the information storage layer 116 may be less than half the distance between the first insulating materials 112.

Between adjacent doping regions among the first to third doping regions 311-313, first conductive materials CL1-CL8 may be provided on exposed surfaces of the information storage layer 116. The conductive materials CL1-CL8 may extend in the first direction. Each conductive material of the conductive materials CL1-CL8 may be provided between two adjacent first insulating materials of the first insulating materials 112. The conductive materials CL1-CL8 may include a metallic conductive material. The conductive materials CL1-CL8 may include, e.g., a non-metallic conductive material such as polysilicon.

On the doping regions 311-313, the conductive materials CL1-CL8 may be divided, e.g., spaced apart, by a wordline cut WL Cut. For example, adjacent stacked structures arranged along the third direction, of which each stacked structure may include the first insulating materials 112 and the conductive materials CL1-CL8, may have the wordline cut WL Cut therebetween. The wordline cut WL Cut may overlap a portion of one of the first to third doping regions 311-313.

According to an exemplary embodiment, the information storage layers 116 provided on a top surface of an uppermost insulating material of the first insulating materials 112 may be removed. The information storage layers 116 provided on a side surface facing the pillars 113 among side surfaces of the insulating materials 112 may be provided, e.g., may remain.

A plurality of drains 320 may be provided on the pillars 113, respectively. Each drain 320 may correspond to one pillar 113. The drains 320 may extend to an upper portion of the channel layer 114 of each pillar 113. Exemplarily, each of the drains 320 may include a second-type semiconductor material (e.g., silicon). For example, each of the drains 320 may include an n-type semiconductor material (e.g., silicon). Hereinafter, for ease of explanation it will be referenced that each of the drains 320 includes n-type silicon. However, each of the drains 320 is not limited to including the n-type silicon.

Bitlines BL1 and BL2 may be provided on the drains 320. The bitlines BL1 and BL2 may extend in a third direction above the pillars 113. The bitlines BL1 and BL2 may be spaced apart from each other at specific intervals. The bitlines BL1 and BL2 may be connected, e.g., electrically connected, to the drains 320. The drains 320 and the bitlines BL1 and BL2 may be connected to each other through contact plugs (not shown) or may be in direct contact with each other. The bitlines BL1 and BL2 may include metallic conductive materials. Exemplarily, the bitlines BL1 and BL2 may include non-metallic conductive materials such as polysilicon.

Hereinafter, rows and columns of the pillars 113 of the memory block BLK1 are defined. The rows of the pillars 113 may be defined depending on whether the conductive materials CL1-CL8 are divided. In FIGS. 3 and 4, it is shown that the conductive materials CL1-CL8 may be divided on the basis of the doping region 312, according to an exemplary embodiment.

Pillars 113 coupled through the conductive materials CL1-CL8 and the information storage layers 116 provided between the first doping region 311 and the second doping region 312 may be defined as first-row pillars. Pillars 113 coupled through the conductive materials CL1-CL8 and the information storage layers 116 provided between the second doping region 312 and the third doping region 313 may be defined as second-row pillars.

The columns of the pillars 113 may be defined according to the bitlines BL 1 and BL2. Pillars 113 coupled through the first bitline BL12 and the drain 320 may be defined as first-column pillars. Pillars 113 coupled through the second bitline BL2 and the drain 320 may be defined as second-column pillars.

Hereinafter, heights of the conductive materials CL1-CL8 are defined. The conductive materials CL1-CL8 may be defined as first to eighth conductive materials CL1-CL8 according to the order from the substrate 111. Accordingly, the first to eighth conductive materials CL1-CL8 may have first to eighth heights, respectively, with respect to the substrate 111. Each of the first to eight heights may be different.

In FIGS. 3 and 4, the pillars 113 may constitute a plurality of cell strings CS together with the information storage layers 116 and the conductive materials CL1-CL8. Each pillar 113 may constitute one cell string CS together with the adjacent information storage layers 116 and adjacent conductive materials CL1-CL8.

Pillars 113 may be arranged on the substrate 111 in the column and row directions. For example, the memory block BLK1 may include a plurality of cell strings CS disposed on the substrate 111 in the row and column directions. Each of the cell strings CS may include a plurality of cell transistors CT stacked in a direction perpendicular to the substrate 111. The cell transistors CT will be described below in detail with reference to FIG. 5.

Figure 5:
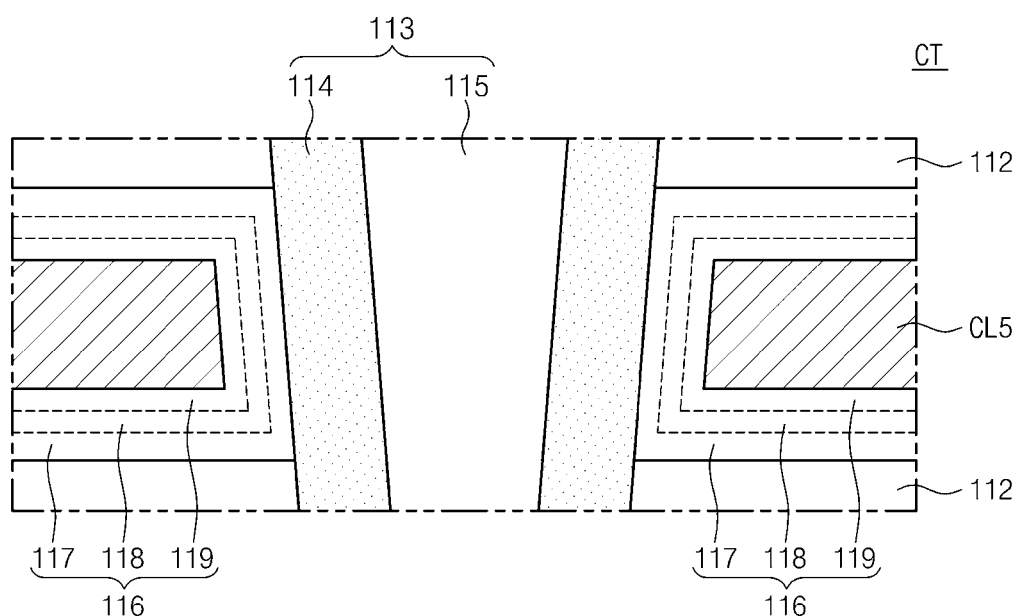
FIG. 5 illustrates an enlarged view of a cell transistor in FIG. 4.

FIG. 5 illustrates an enlarged view of one of the cell transistors CT in FIG. 4. Referring to FIGS. 3 to 5, of the cell transistors, a cell transistor having a fifth height may include the fifth conductive material CL5, a portion of a pillar 113 corresponding to the fifth conductive material CL5, and information storage layers 116 provided between the fifth conductive material CL5 and pillars 113.

The information storage layers 116 may extend to top and bottom surfaces of the conductive materials CL1-CL8 from between the conductive materials CL1-CL8 and the pillars 113. The information storage layers 116 may include at least one of first to third sub layers, e.g., sub-insulating layers, 117, 118, and 119, e.g., as illustrated in FIG. 5.

In the cell transistors CT, channel layers 114 of the pillars 113 may include, e.g., the same p-type silicon as the substrate 111. The channel layers 114 may act as a body in the cell transistor CT. The channel layers 114 may be formed in a direction perpendicular to the substrate 111. Accordingly, the channel layers 114 of the pillars 113 may be defined to act as a vertical body. A channel region formed at the channel layers 114 of the pillars 113 may be a vertical channel.

A first sub layer 117 may be adjacent to the pillars 113 and may act as a tunneling insulating layer, e.g., may be an insulating material. For example, the first sub layer 117 may be adjacent to the pillars 113 and may include a thermal oxide and/or a semiconductor oxide. According to an exemplary embodiment, the first sub layer 117 may include, e.g., silicon oxide.

A second sub layer 118 may act as a charge storage layer. For example, the second sub layer 118 may act as a charge trapping layer. The second sub layer 118 may include, e.g., a nitride and/or a metal oxide (e.g., aluminum oxide, hafnium oxide, etc.). The second sub layer 118 may include, e.g., silicon oxide.

A third sub layer 119 adjacent to the conductive material CL5 acts as a blocking insulting layer. For example, the third sub layer 119 may have a single-layer structure or a multi-layer structure. The third sub layer 119 may be a high-k dielectric layer (e.g., aluminum oxide layer, hafnium oxide layer, etc.) having a higher dielectric constant than the first and second sub layers 117 and 118. The third sub layer 119 may include, e.g., silicon oxide.

According to an exemplary embodiment, the first to third sub layers 117, 118, and 119, e.g., sub-insulating layers, may constitute an oxide-nitride-oxide (ONO) structure.

The fifth conductive material CL5 may act as a gate (or control gate). For example, the fifth conductive material CL5 acting as the gate (or control gate), the third sub layer 119 acting as the blocking insulating layer, the second sub layer 118 acting as the charge storage layer, the first sub layer 117 acting as a tunneling insulating layer, and the channel layer 114 acting as a vertical body act together may act as a cell transistor. For example, the fifth conductive material CL5, the third sub layer 119, the second sub layer 118, the first sub layer 117, and the channel layer 114 may act as a charge trap type cell transistor.

In each cell string CS, cell transistors CT therein may be differently used according to their heights. For example, among the cell transistors CT, at least one cell transistor provided at an upper portion of the cell string CS may be used as a string selection transistor SST. Among the cell transistors CT, at least one cell transistor provided at a lower portion of the cell may be used as a ground selection transistor GST. The other cell transistors may be used as a memory cell and a dummy memory cell.

The conductive materials CL1-CL8 may extend in a row direction (first direction) to be coupled to a plurality of pillars in the row direction. For example, the conductive materials CL1-CL8 and the pillars 113 may constitute a plurality of cell strings CS that are spaced at specific intervals in the row direction. The conductive materials CL1-CL8 may constitute conductive lines connecting cell transistors CT having the same height of cell strings CS of the same row.

According to an exemplary embodiment, the conductive materials CL1-CL8 may each be used as one of a string selection line SSL, a ground selection line GSL, a wordline WL, or a dummy wordline DWL.

As described with reference to FIG. 5, the second sub layer 118 of each information storage layer 116 may act as a charge trapping layer. For example, the amount of electrons trapped to the second sub layer 118 may be changed when the cell transistors CT are programmed or erased.

Exemplarily, a fifth cell transistor formed by the fifth conductive material CL5 and a sixth cell transistor formed by the sixth conductive material CL6 may be different in threshold voltage. For example, an electric field may be established between the second sub layer 118 of the fifth cell transistor and the second sub layer 118 of the sixth cell transistor. The electric field may allow the electrons trapped to the second sub layer 118 to spread out. This phenomenon is called "spreading".

Without intending to be bound by this theory, when the electrons trapped to the second sub layer 118 spread out, a threshold voltage of the cell transistors CT may be shifted. That is, e.g., data stored in the cell transistors CT may be lost.

However, according to an exemplary embodiment, the first insulating materials 112 may be provided between the conductive materials CL1-CL8. As described above, the first insulating materials 112 may include a nitride, e.g., a semiconductor nitride. Since the semiconductor nitride itself may have negative characteristics, an electric field between the conductive materials CL1-CL8 may be attenuated, e.g., confined to a predetermined area, by the first insulating materials 112. For example, since the spreading may be reduced and/or prevented by the first insulating materials 112 including the semiconductor nitride, reliability of the nonvolatile memory device (100 in FIG. 1) may be enhanced.

Figure 6:
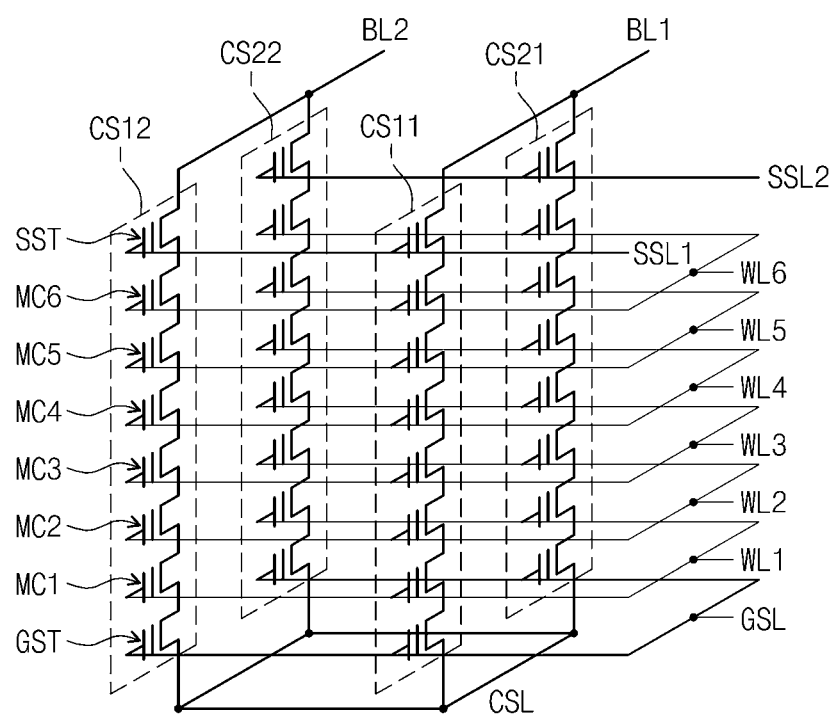
FIG. 6 illustrates a circuit diagram of an equivalent circuit of the memory block described with reference to FIGS. 3 and 4.

FIG. 6 illustrates a circuit diagram of an equivalent circuit of the memory block BLK1 described with reference to FIGS. 3 and 4. Referring to FIGS. 3 to 6, cell strings CS11 and CS21 may be provided between the first bitline BL1 and the common source line CSL, e.g., the cell strings CS11 and CS21 may be electrically connected to the first bitline BL1. Cell strings CS12 and CS22 may be provided between the second bitline BL2 and the common source line CSL, e.g., the cell strings CS12 and CS22 may be electrically connected to the second bitline BL2. The cell strings CS11, CS21, CS12, and CS22 may correspond to the pillars 113, respectively.

In the cell strings CS11, CS12, CS21, and CS22, first cell transistors may act as ground selection transistors, respectively. Cell strings of the same row may share a ground selection line GSL. Cell strings of different rows share ground selection lines GSL. The first conductive materials CL1 may be connected to each other to form a ground selection line.

In the cell strings CS11, CS12, CS21, and CS22, second to sixth transistors may act as memory cells MC1-MC6. Memory cells having substantially the same height, e.g., from the substrate, and corresponding to the same row may share a wordline WL. Memory cells MC having substantially the same height and corresponding to different rows may share wordlines WL. That is, memory cells having the same height may share wordlines WL.

According to an exemplary embodiment, ones of the second conductive materials CL2 may be commonly connected to form a first wordline WL1. Ones of the third conductive materials CL3 may be commonly connected to form a second wordline WL2. Ones of the fourth conductive materials CL4 may be commonly connected to form a third wordline WL3. Ones of the fifth conductive materials CL5 may be commonly connected to form a fourth wordline WL4. Ones of the sixth conductive materials CL6 may be commonly connected to form a fifth wordline WL5. Ones of the seventh conductive materials CL7 may be commonly connected to form a sixth wordline WL6.

In the cell strings CS11, CS12, CS21, and CS22, eighth cell transistors may operate as string selection transistors. Cell strings of the same row may share a string selection line SSL. Cell strings of different rows may be connected to different string selection lines. The first and second string selection lines SSL1 and SSL2 may correspond to the eighth conductive materials CL8. For example, it may be understood that the pillars 113, e.g., rows of cell strings, may be defined by the string selection lines SSL1 and SSL2.

Hereinafter, string selection transistors SST connected to the first string selection line SSL1 are defined as first string selection transistors SST, and string selection transistors SST connected to the second string selection line SSL2 are defined as second string selection transistors SST.

The common source line CSL may be commonly connected to cell strings. For example, the first to third doping regions 311-313 may be connected to each other to form the common source line CSL.

As illustrated in FIG. 6, wordlines WL having the same height may be connected in common. For example, when a wordline WL having a specific height is selected, all cell strings connected to the selected wordline WL may be selected.

Cell strings of different rows may be connected to different string selection lines SSL. Accordingly, by selecting and unselecting the string selection lines SSL1 and SSL2, among cell strings connected to the same wordline WL, cell strings of an unselected row may be electrically insulated from a corresponding bitline BL and cell strings of a selected row may be electrically connected to the corresponding bitline BL.

For example, rows of cell strings CS may be selected by selecting and unselecting the string selection lines SSL1 and SSL2. In addition, columns of cell strings CS of a selected row may be selected by selecting the bitlines BL1 and BL2.

Exemplarily, at least one of the wordlines WL may be used as a dummy wordline DWL. For example, at least one of a wordline WL having a height adjacent to the string selection line SSL, a wordline WL having a height adjacent to the ground selection line GSL, a wordline having a height between the string selection line SSL and the ground selection line GSL may be used as a dummy wordline DWL.

Conductive materials corresponding to at least two heights may constitute string selection lines SSL. For example, the seventh conductive materials CL7 and the eighth conductive materials CL8 may constitute string selection lines SSL, respectively. In this case, the seventh and eighth conductive materials CL7 and CL8 provided at the same row and having different heights may be commonly connected to one string selection line SSL.

Conductive materials corresponding to at least two heights may constitute a ground selection line GSL. For example, the first conductive materials CL1 and the second conductive materials CL2 may be commonly connected to constitute a ground selection line GSL. The first conductive materials CL1 may each constitute two ground selection lines GSL electrically insulated from each other.

Figure 7:
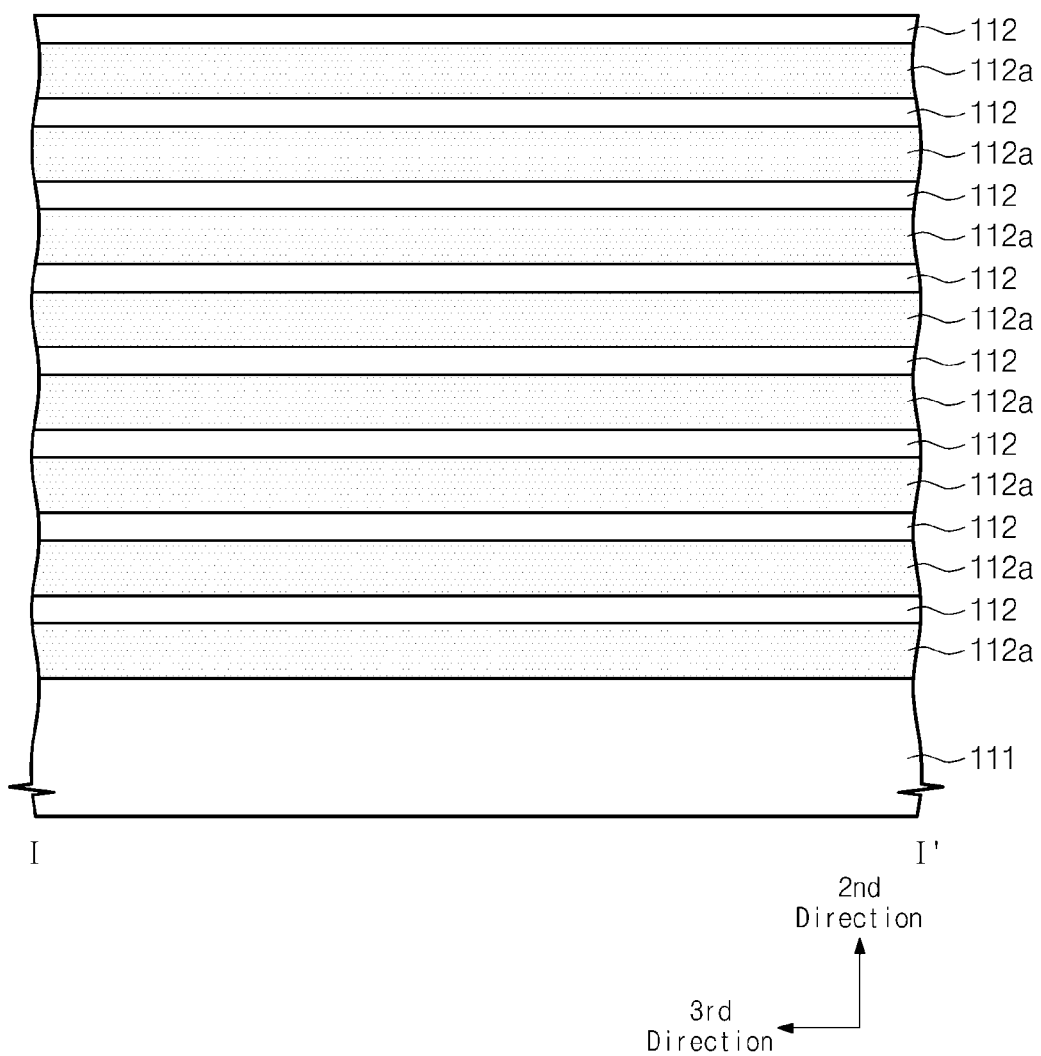
FIGS. 7 to 13 illustrate cross-sectional views depicting stages in an exemplary method of forming the memory block described with reference to FIGS. 3 and 4.

FIGS. 7 to 13 illustrate cross-sectional views depicting stages in a procedure of forming the memory block BLK1 described with reference to FIGS. 3 and 4. Referring to FIG. 7, second insulating materials 112a and first insulating materials 112 may be alternately stacked on a substrate 111 to form a stacked structure. For example, the second insulating material 112a may first be stacked on, e.g., directly on, the substrate 111 and the first insulating layer 112 may be stacked on the second insulating material 112a. Then, the first insulating layer 112 may be stacked on the second insulating material 112a, and the second insulating material 112a may be stacked on the first insulating layer 112. The second insulating materials 112a may include, e.g., silicon oxide. The first insulating materials 112 may include silicon nitride.

Figure 8:
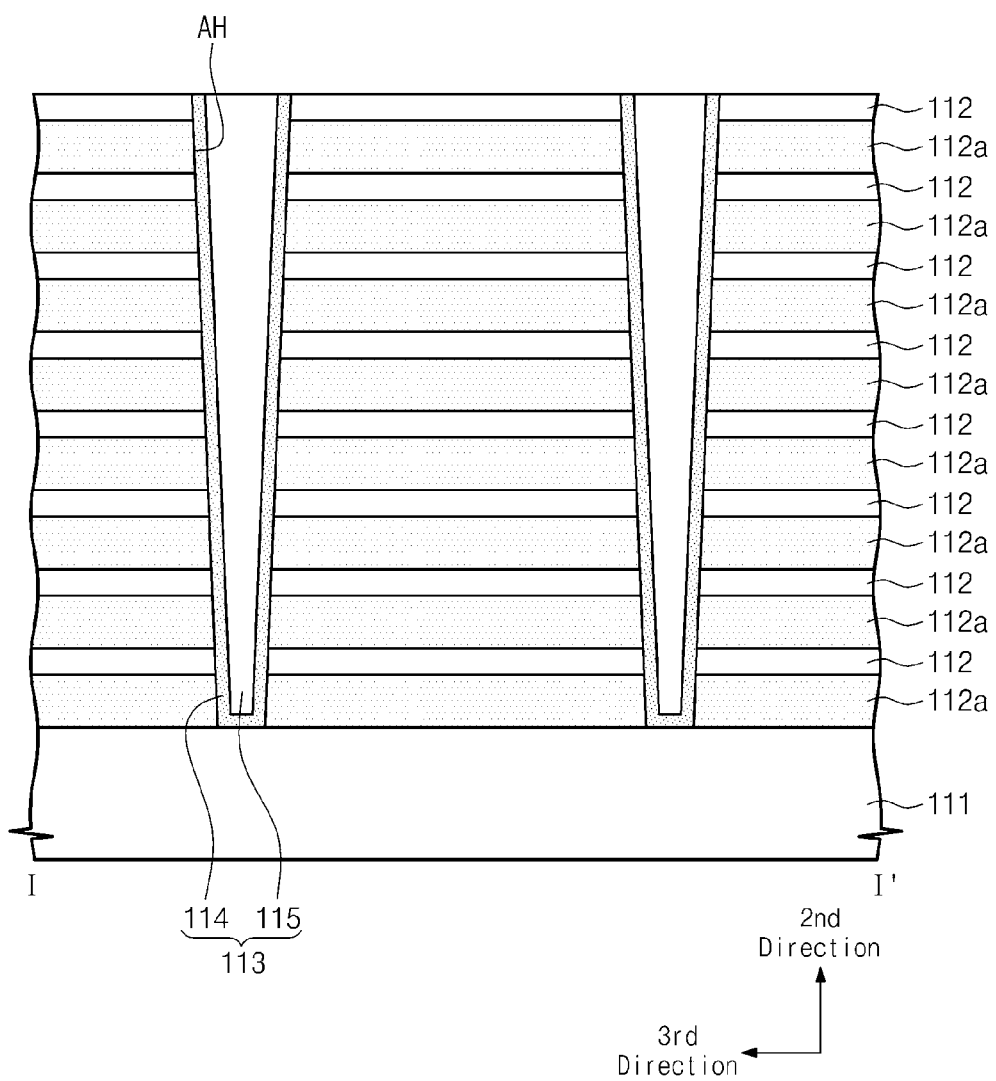

Referring to FIG. 8, active holes AH may be formed through the first and second insulating materials 112 and 112a in a direction perpendicular to the substrate 111. The active holes AH may be formed to expose the substrate 111. The active holes AH may be spaced apart in the row and column directions.

Channel layers 114 may be formed on inner surfaces of the active holes AH, respectively. The channel layers 114 may have the same conductivity type. The channel layers 114 may include, e.g., intrinsic or undoped semiconductor material. Inner materials 115 may be provided in the channel layers 114, respectively. The inner materials 115 may include, e.g., a semiconductor oxide, a semiconductor nitride, and/or an insulating material such as air gap. The inner materials 115 may fill the active holes AH including the channel layers 114. One channel layer and one inner material in a specific active hole may together constitute one pillar 113. For example, the channel layers 114 and the inner materials 115 constitute pillars 113, respectively.

Figure 9:
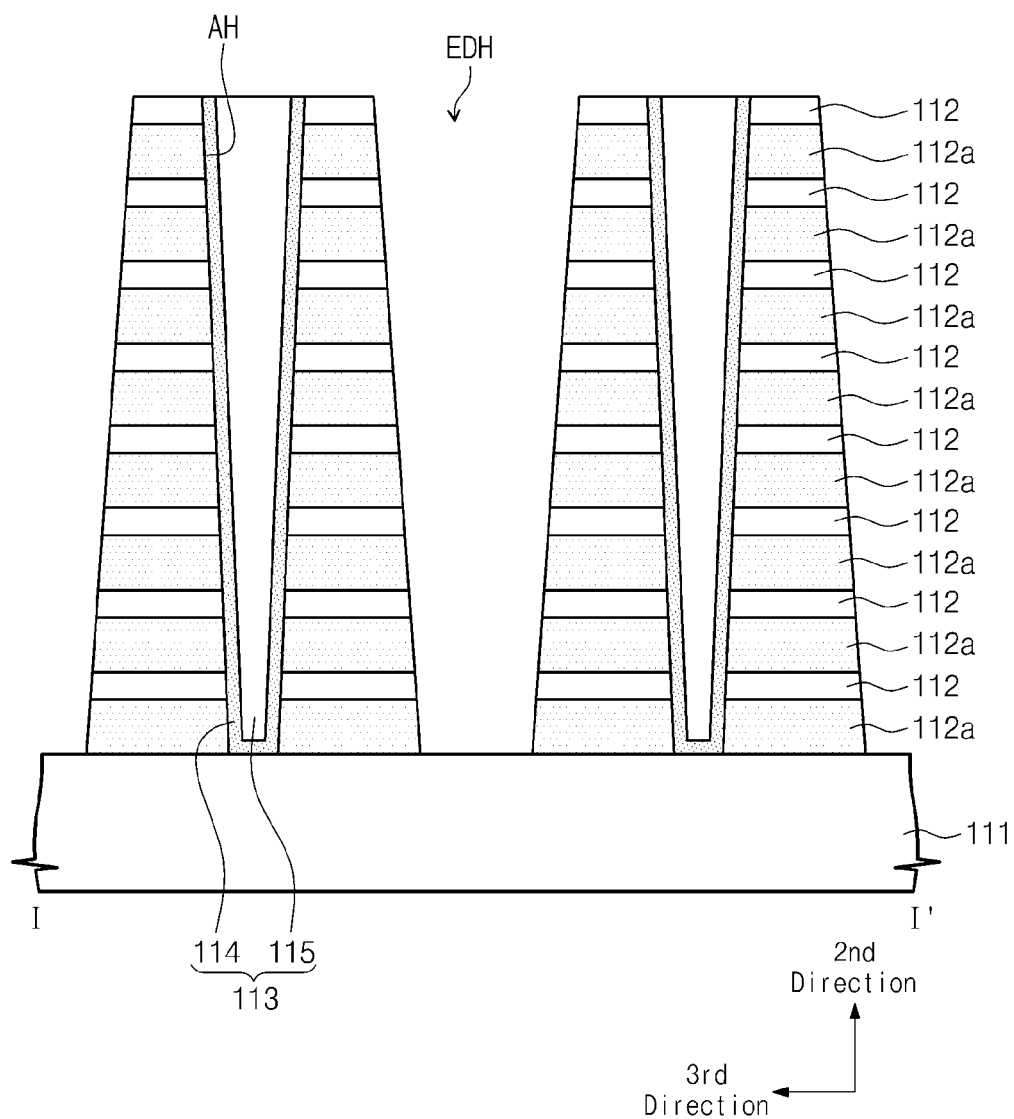

Referring to FIG. 9, electrode dividing holes EDH may be formed through the first and second insulating materials 112 and 112a in the direction perpendicular to the substrate 111. The electrode dividing holes EDH may be formed to expose the substrate 111. Each electrode dividing hole EDH may be disposed between adjacent pillars 113. For example, the electrode dividing holes EDH may extend between pillars 113 in the first direction. That is, the electrode dividing holes EDH may divide the first and second insulating materials 112 and 112a in the first direction and/or divide the pillars 113 in the first direction. The electrode dividing holes EDH may extend in the second direction, e.g., the electrode dividing hole EDH may be between two adjacent rows of the pillars 113 extending in the second direction.

Figure 10:
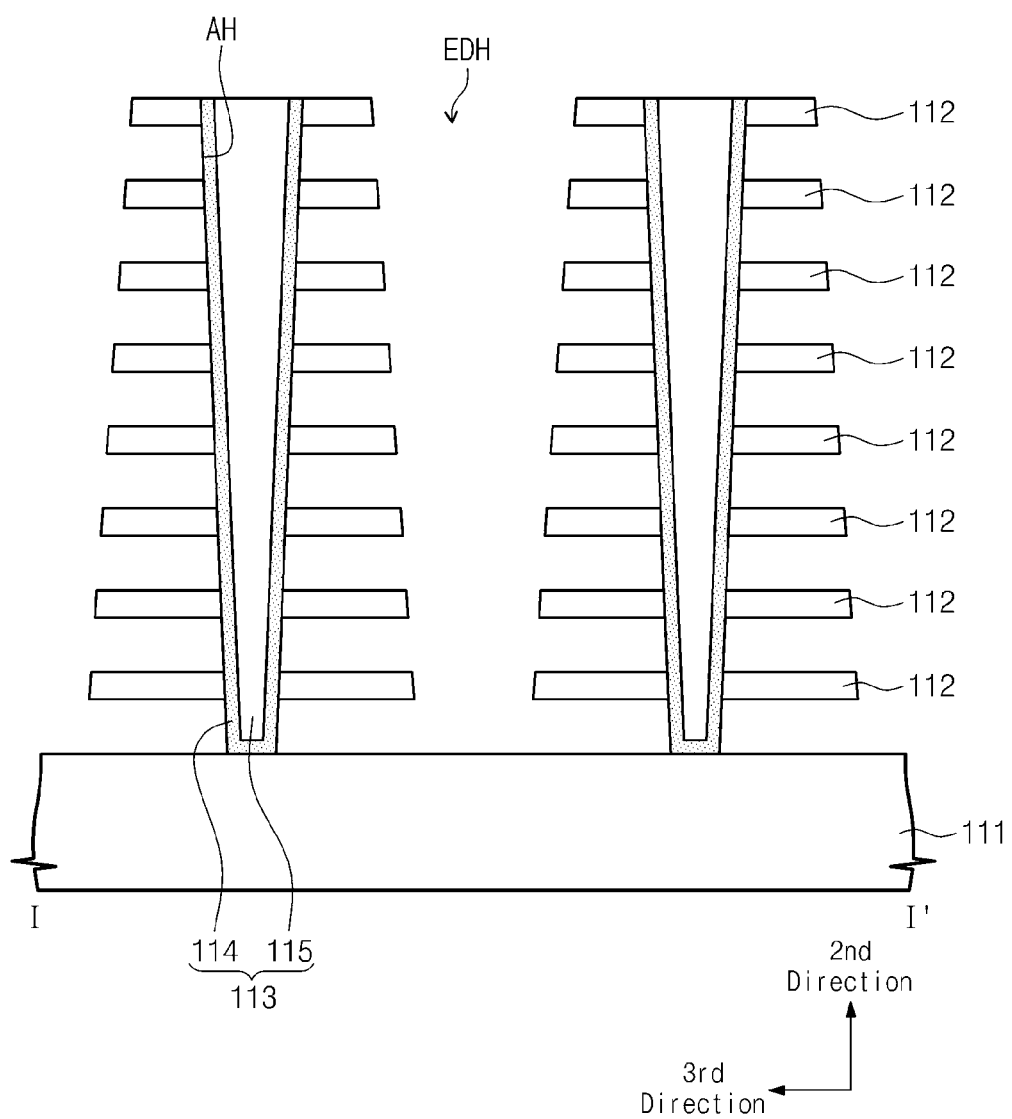

Referring to FIG. 10, the second insulating materials 112a may be selectively removed among the first and second insulating materials 112 and 112a. For example, the second insulating materials 112a may be removed by injecting a material having an etching selectivity with respect to the first and second insulating materials 112 and 112a through the electrode dividing holes EDH. Thereafter, a top surface of the substrate 111, outer side surfaces of the pillars 113, top surfaces and bottom surfaces of the first insulating materials 112, and side surfaces of the first insulating materials 112 facing the adjacent pillars 113 may be exposed.

Figure 11:
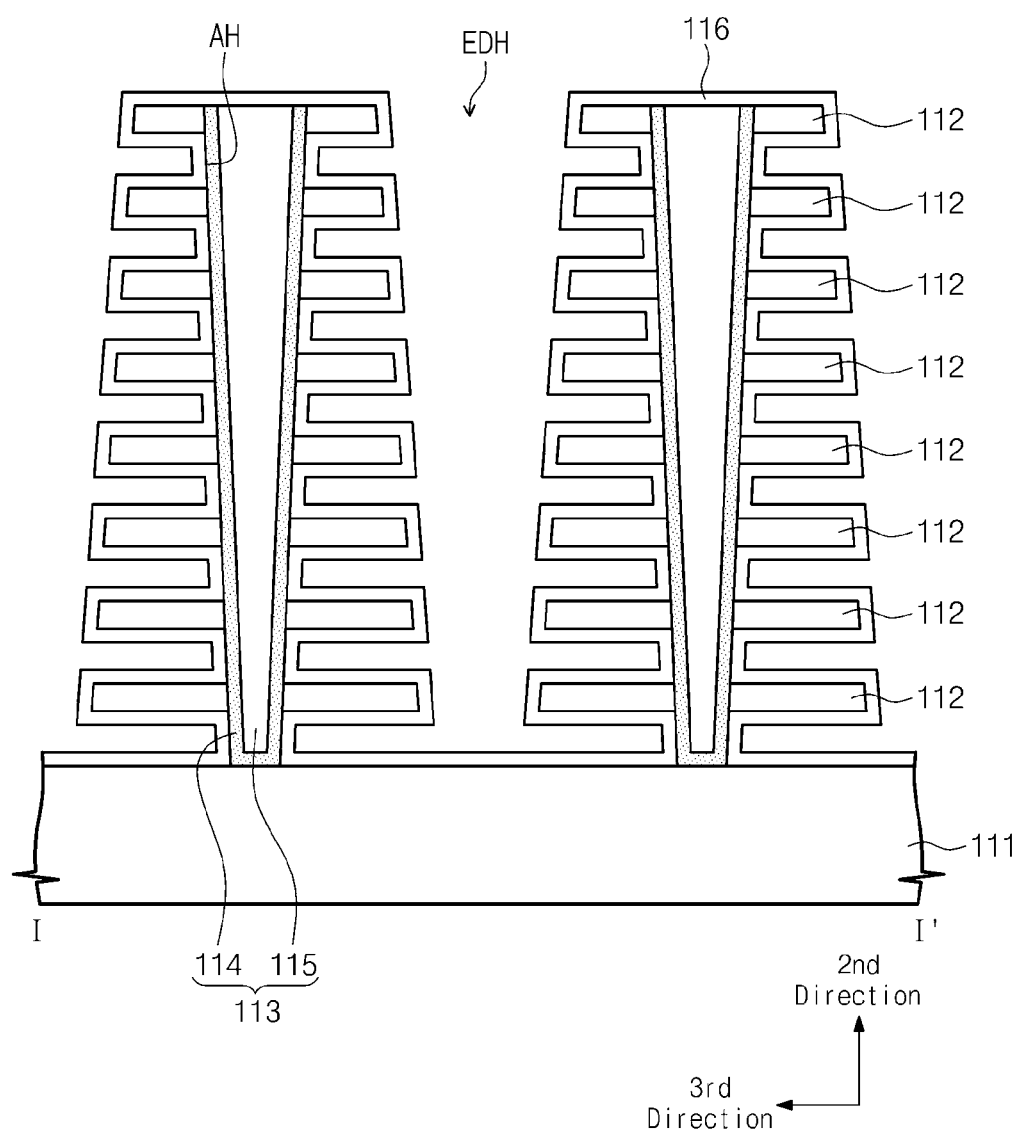

Referring to FIG. 11, storage information layers 116 may be formed, e.g., conformally formed, on the exposed surfaces of the substrate 111, the top and bottom surfaces of the first insulating materials 112, the and the pillars 113. For example, the information storage layers 116 may be conformally formed on the top surface of the substrate 111, the outer side surfaces of the pillars 113, the top and bottom surfaces of the first insulating materials 112, and the side surfaces of the first insulating materials 112 facing the adjacent pillars 113.

Figure 12:
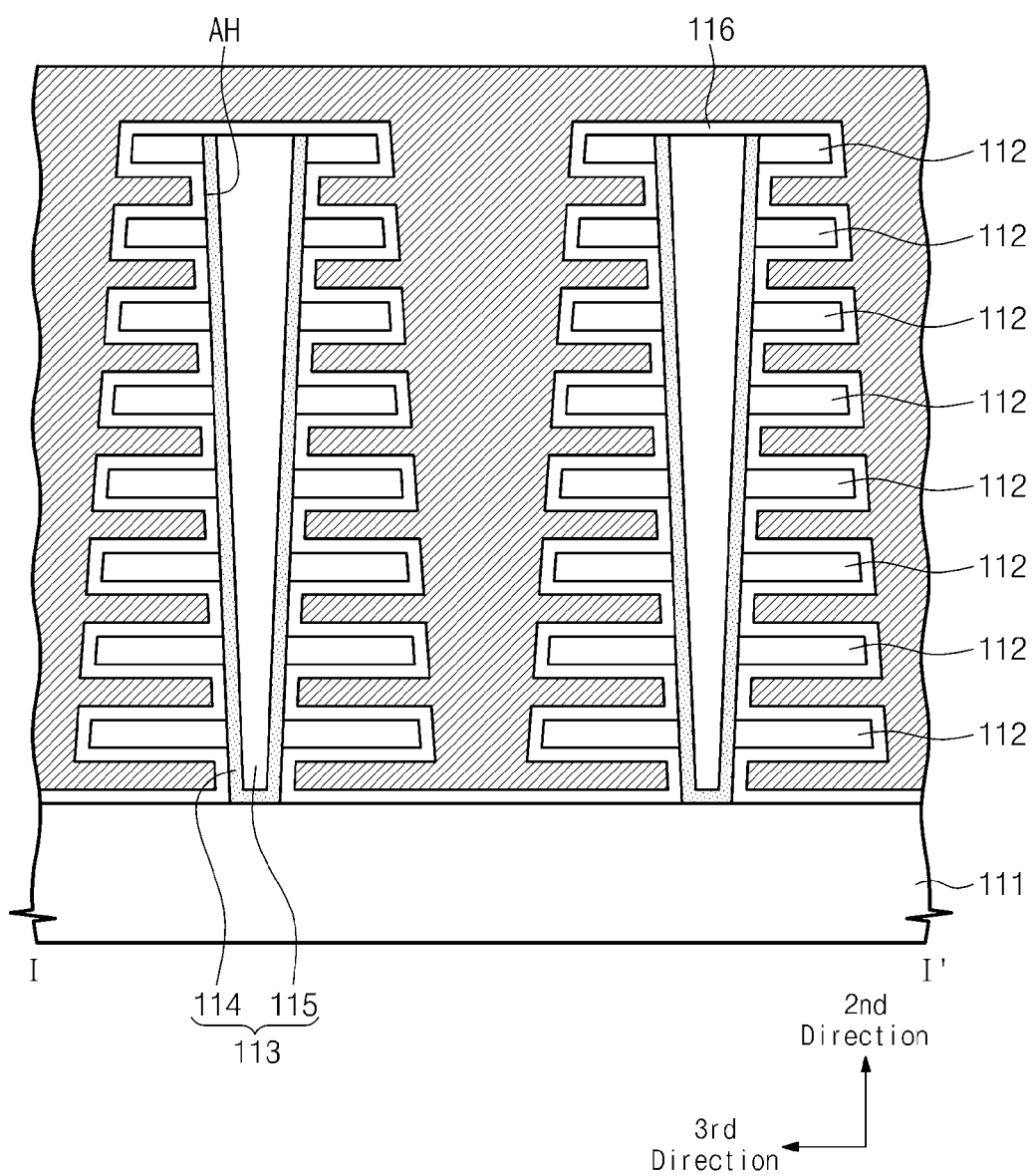

Referring to FIG. 12, a conductive layer CM may be formed on exposed surfaces of the information storage layers 116. The conductive layer CM may fill the electrode dividing holes EDH (in FIG. 11) and may fill spaces between the first insulating materials 112. For example, the conductive layer CM may fill a space between the information storage layers 116, e.g., in regions where the second insulating materials 112a were previously situated.

Figure 13:
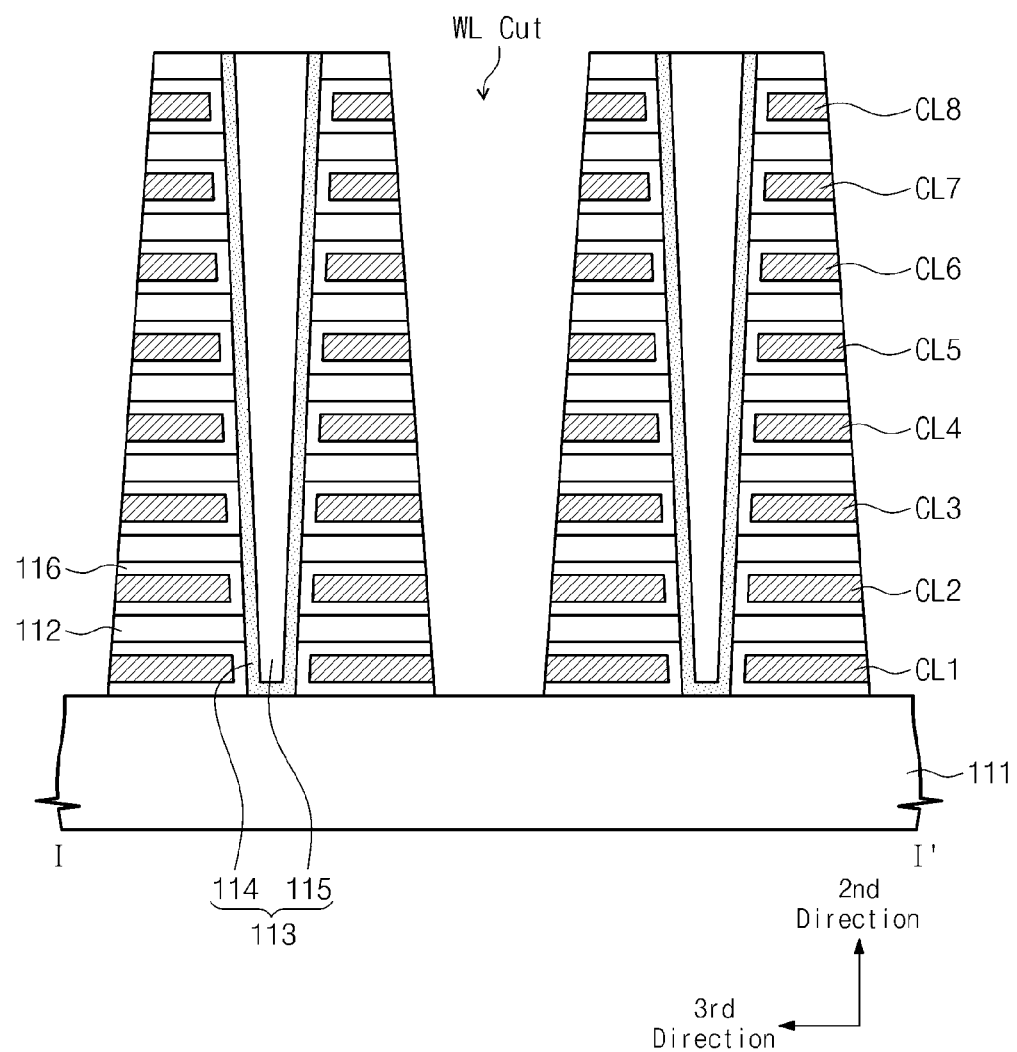

Referring to FIG. 13, portions of the information storage layers 116 and the conductive layer CM formed on an uppermost insulating material of the first insulating materials 112 may be removed by means of, e.g., a planarization process. For example, the information storage layers 116 and the conductive layer CM may remain in regions where the second insulating materials 112a were previously situated, e.g., in the voids left by removing the second insulating materials 112a. A wordline cut WL Cut may be formed through the first insulating materials 112 and the conductive layer CM in the direction perpendicular to the substrate 111. The wordline cut WL Cut may be formed to expose the substrate 111, e.g., by removing portions of the information storage layers 116 and the conductive layer CM filling the electrode dividing holes EDH. The wordline cut WL Cut may extend between the pillars 113 in the first direction. For example, the wordline cut WL Cut may divide the first insulating material 112 and the conductive layer CM in the first direction. From another standpoint, the wordline cut WL Cut may divide the pillars 113. The conductive layer CM may be divided by the wordline cut WL Cut to form conductive materials CL1-CL8 that are spaced apart.

The wordline cut WL Cut may be formed in a region corresponding to an electrode dividing hole (EDH in FIG. 11). For example, among the information storage layers 116, portions of the information storage layer 116 provided on side surfaces facing the pillars 113 of the first insulating materials 112 may be removed when the wordline cut WL Cut is formed. The wordline cut WL Cut may have sloped outer walls such that a width thereof in the third direction may increase as a distance from the substrate increases. Accordingly, a width of the conductive materials CL1-CL8 in the third direction may decrease as a distance from the substrate increases.

Returning to FIG. 4, specific elements, e.g., impurities, may be injected through the wordline cut WL Cut to form the doping regions 311-313. The doping regions 311-313 may have a different conductivity type than the substrate 111. Thereafter, the wordline cut WL Cut may be filled with an insulating material.

Drains 320 may be formed on the pillars 113. The drains 320 may include a semiconductor material having a different conductivity type than the channel layer 114. The pillars 113 may include a semiconductor material having a different conductivity type than the doping regions 311-313. The drains 320 may extend onto the channel layers 114 of the pillars 113. For example, the drains 320 may overlap upper surfaces of both the channel layer 114 and the inner materials 115 in the pillars 113.

Bitlines BL1 and BL2 may be formed on the drains 320. The bitlines BL1 and BL2 may include a conductive material such as polysilicon and/or a metallic material. If the doping regions 311-313, the drains 320, and the bitlines BL1 and BL2 are formed, a nonvolatile memory device including the memory block BLK1 having the structure described with reference to FIGS. 3 and 4 may be provided.

Figure 14:
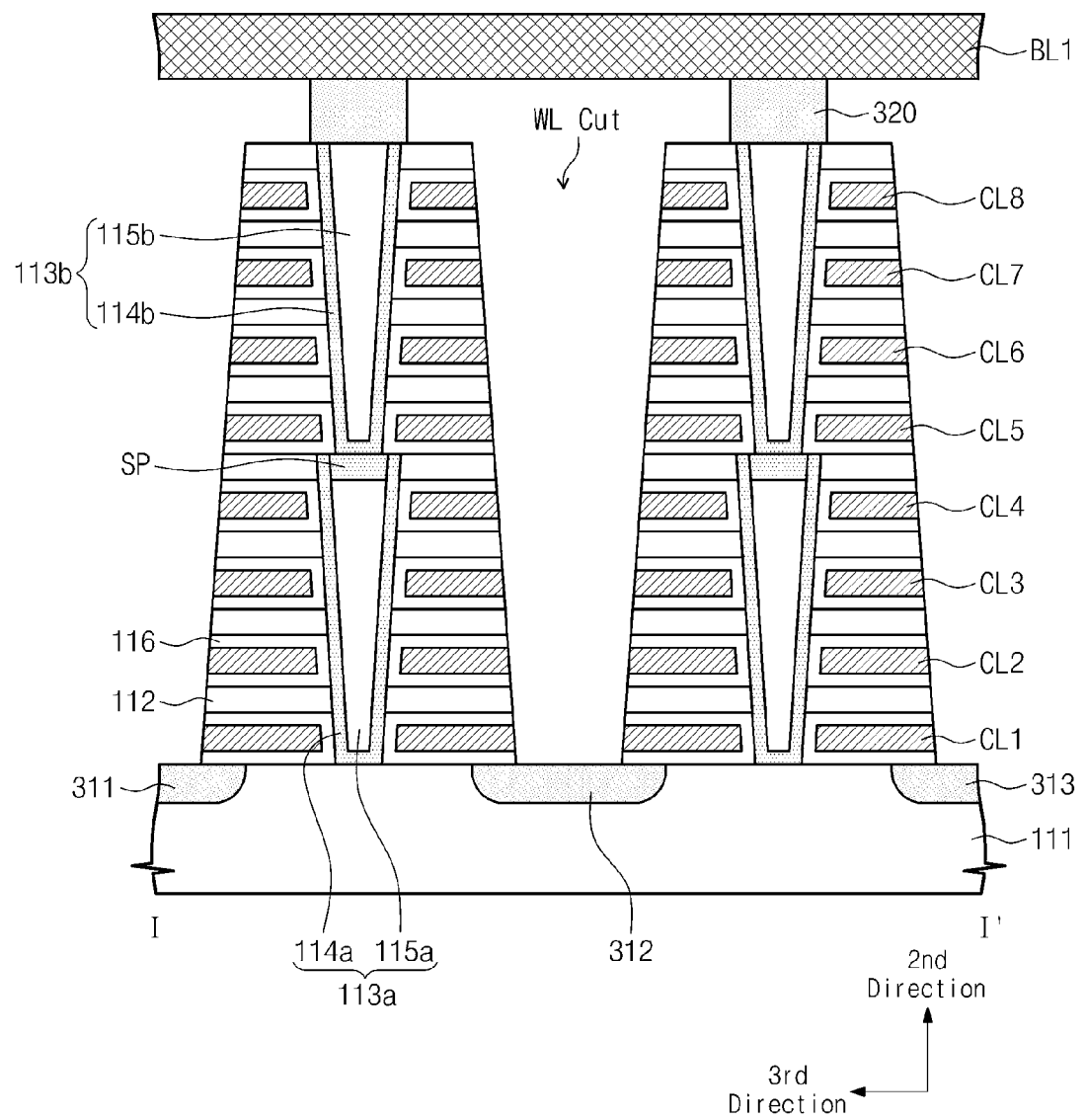
FIG. 14 illustrates another exemplary embodiment of a cross-sectional view taken along the line I-I' in FIG. 3.

FIG. 14 illustrates another exemplary embodiment of a cross-sectional view taken along the line I-I' in FIG. 3. Referring to FIGS. 3 and 14, the memory block BLK1 includes structures extending in the first to third directions.

The configuration shown in FIG. 14 is similar to the configuration shown in FIG. 4, except that pillars include first sub-pillars 113a and second sub-pillars 113b on the first sub-pillars 113a. According to an exemplary embodiment, first insulating materials 112 provided between conductive materials CL1-CL8 may have negative characteristics. Thus, the possibility of spreading may be reduced and/or prevented to, e.g., help improve reliability of a nonvolatile memory device (100 in FIG. 1).

First channel layers 114a of the first sub-pillars 113a may include the same material as described with reference to channel layers 114 of the pillars 113. Second channel layers 114b of the second sub-pillars 113b may include the same material as described with reference to channel layers 114 of the pillars 113.

First inner materials 115a of the first sub-pillars 113a may include the same material as described with reference to inner materials 115. Second inner materials 115b of the second sub-pillars 113b may include the same material as described with reference to inner materials 115.

Semiconductor pads SP may be provided on the first sub-pillars 113a. The first channel layers 114a of the first sub-pillars 113a and the second channel layers 114b of the second sub-pillars 113b may be connected to each other through the semiconductor pads SP, respectively.

Among the conductive materials CL1-CL8, conductive materials having a height corresponding to that of the semiconductor pads SP, e.g., the fourth conductive pads CL4, the fifth conductive pad CL5, or the fourth and fifth conductive pads CL4 and CL5 may be used with and/or as dummy wordlines DWL.

Figure 15:
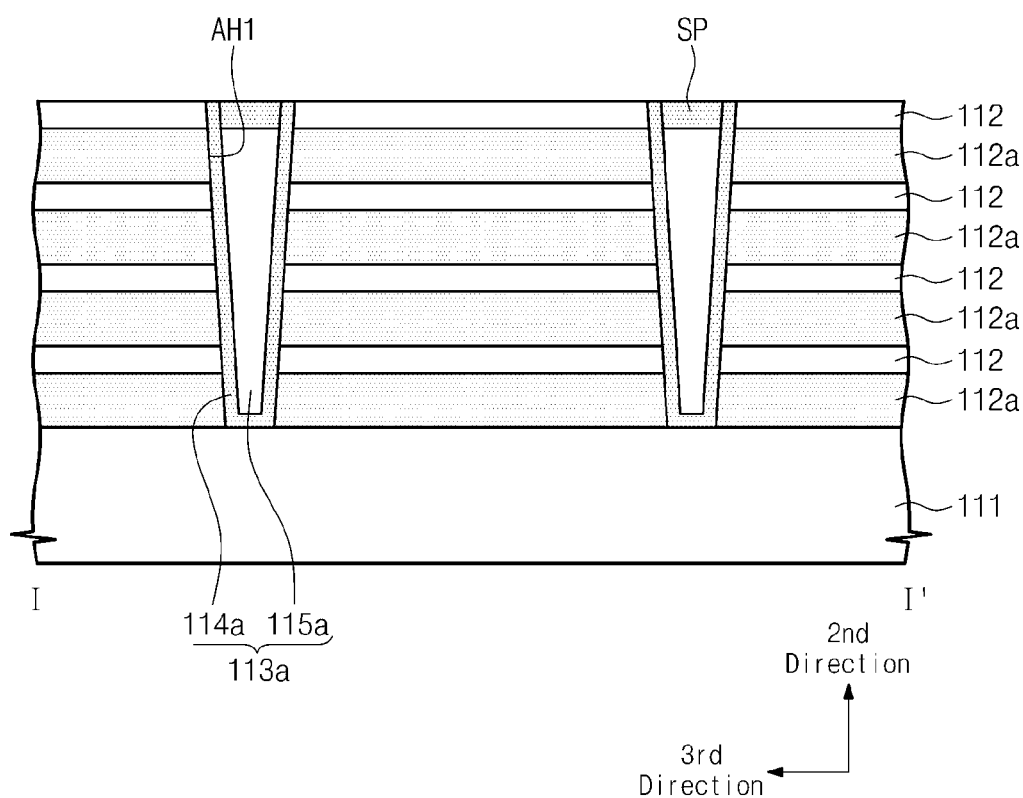
FIGS. 15 and 16 illustrate cross-sectional depicting stages in an exemplary method of forming a memory block described with reference to FIGS. 3 and 14.
Figure 16:
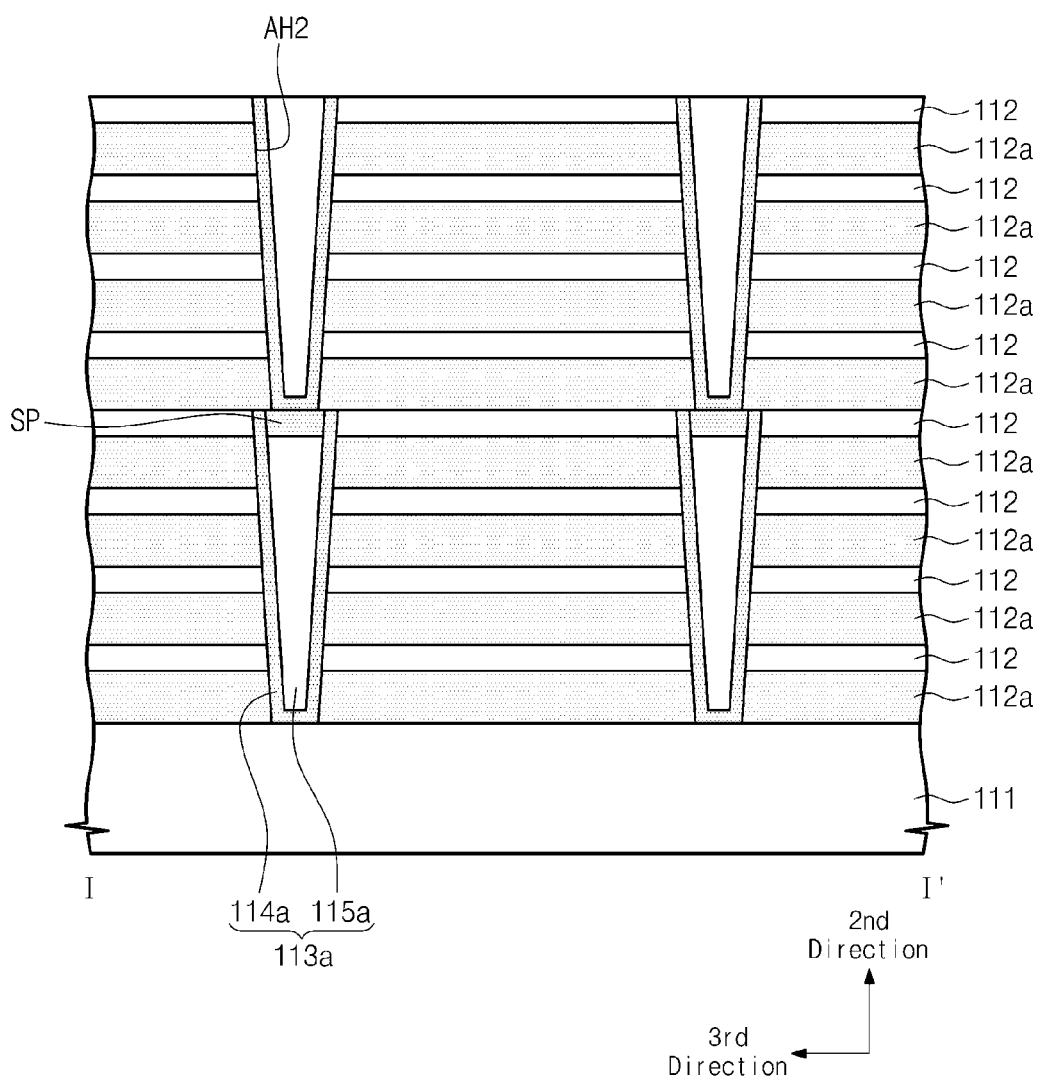

FIGS. 15 and 16 illustrate cross-sectional views depicting stages in a procedure for forming the memory block BLK1 described with reference to FIGS. 3 and 14. Referring to FIG. 15, second insulating materials 112a and first insulating materials 112 may be alternately stacked on the substrate 111. For example, a second insulating material 112a may be stacked on, e.g., directly on, the substrate 111 and a first insulating material 112 may be stacked on the second insulating material 112a. Thereafter, the first insulating material 112 may be stacked on the second insulating material 112a, and the second insulating material 112a may be stacked on the first insulating material 112. The second insulating materials 112a and the first insulating materials 112 may be alternately stacked to a specific height. The second insulating materials 112a may include, e.g., semiconductor oxide. The first insulating materials 112 may include, e.g., semiconductor nitride.

First active holes AH1 may be formed through the first and second insulating materials 112 and 112a in a direction perpendicular to the substrate 111. The first active holes AH1 may be formed to expose the substrate 111.

First channel layers 114a may be formed on inner surfaces of the first active holes AH1, respectively. The first channel layers 114a may have the same conductivity type as the substrate 111. The first channel layers 114a may include an intrinsic or undoped semiconductor material. First inner materials 115a may be provided in the first active holes AH1 including the first channel layers 114a. The first inner materials 115a may include, e.g., a semiconductor oxide, a semiconductor nitride, and/or an insulating material such as and an air gap. A first inner material and a first channel layer in a specific active hole may constitute a first sub-pillar. For example, the first channel layers 114a and the first inner materials 115a may constitute first sub-pillars 113a, respectively.

Upper portions of the first inner materials 115a of the first sub-pillars 113a may be recessed. Semiconductor pads SP may be formed in regions where the first inner materials 115a are recessed. The semiconductor pads SP may include the same material as the first channel layers 114a. Upper portions of the first channel layers 114a may surround corresponding ones of the semiconductor pads SP.

Referring to FIG. 16, the second insulating materials 112a and the first insulating materials may be additionally stacked alternately on the structure illustrated in FIG. 15. Thereafter, second active holes AH2 may be formed through the first and second insulating materials 112 and 112a additionally stacked on the structure illustrated in FIG. 15, e.g., in the direction perpendicular to the substrate 111. The second active holes AH2 may be formed on a region where the first active holes AH1 are provided. The second active holes AH2 may be formed to expose the first sub-pillars 113a, e.g., the semiconductor pads SP of the first sub-pillars 113a.

Second channel layers 114b may be formed on inner surfaces of the second active holes AH2, respectively. The second channel layers 114b may include the same material as the first channel layers 114a. Second inner materials 115b may be provided in the second channel layers 114b, respectively. For example, the second inner materials 115b may fill the second active holes AH2 including the second channel layers 114a. The second inner materials 115b may include the same material as the first inner materials 114a. A channel layer and an inner material in a specific second active hole may constitute a second sub-pillar. For example, the second channel layers 114b and the second inner materials 115b may constitute second sub-pillars 113b, respectively.

Thereafter, e.g., a described with reference to FIGS. 9 to 13, electrode dividing holes EDH may be formed, second insulating materials 112a may be removed, information storage layers 116 may be conformally formed, a conductive layer CM may be formed, a planarization process may be performed, and a wordline cut WL Cut may be formed. And then, doping regions 311-313 may be formed, drains 320 may be formed, and bitlines BL1 and BL2 may be formed so that the structure illustrated in FIG. 14 may be achieved.

Figure 17:
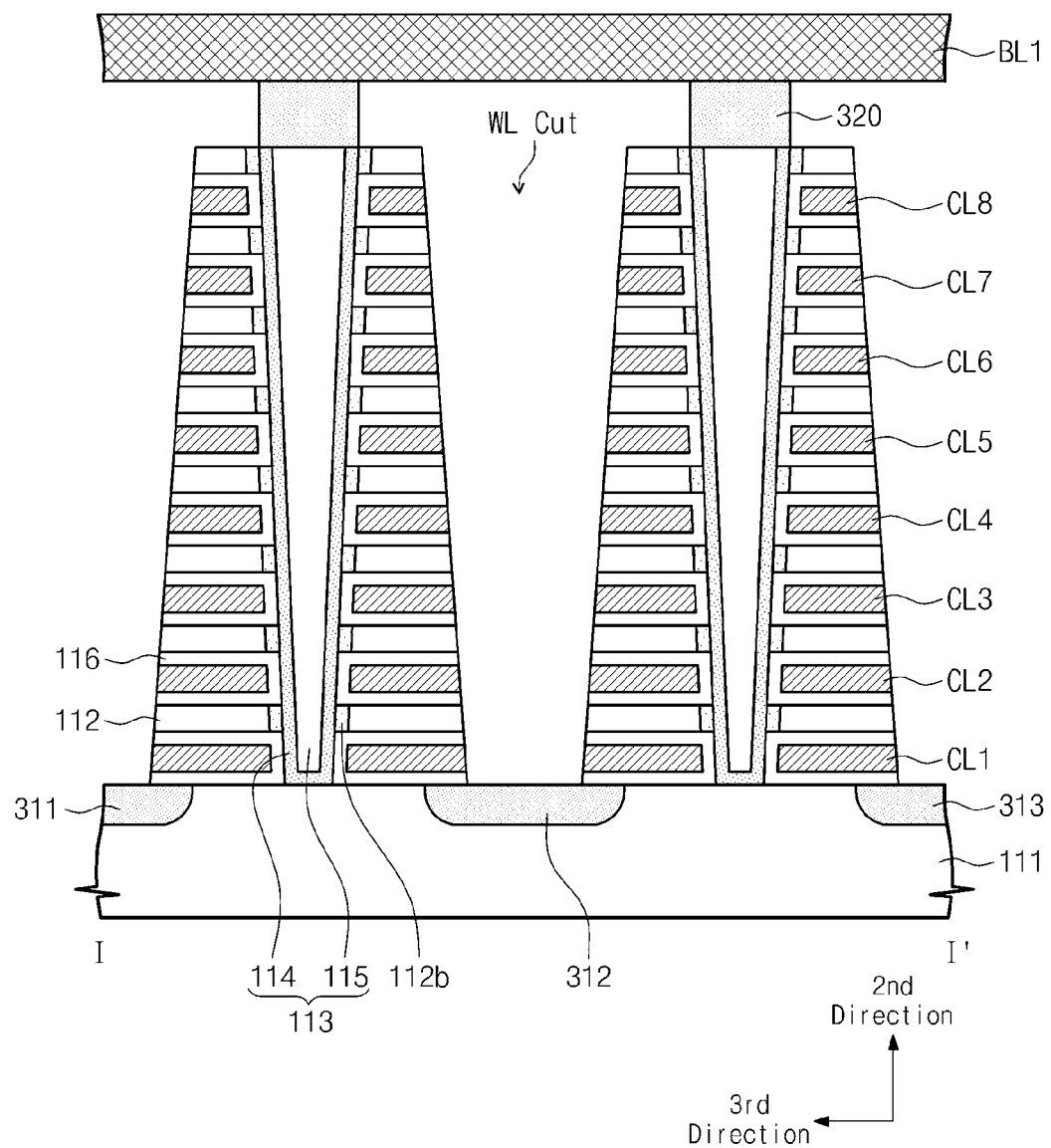
FIG. 17 illustrates another exemplary embodiment of a cross-sectional view taken along the line I-I' in FIG. 3.

FIG. 17 illustrates another exemplary embodiment of a cross-sectional view taken along the line I-I' in FIG. 3. Referring to FIGS. 3 and 17, the memory block BLK1 includes structures extending in first to third directions.

The structure shown in FIG. 17 is similar to that described with reference to FIG. 4, except that third insulating materials 112b are provided between first insulating materials 112 and pillars 113. According to an exemplary embodiment, first insulating materials 112 provided between conductive materials CL1-CL8 have negative characteristics. Thus, the possibility of spreading may be reduced and/or prevented to, e.g., help enhance reliability of a nonvolatile memory device (100 in FIG. 1).

A stress may be caused at a semiconductor channel by the semiconductor nitride. Accordingly, when the first insulating materials 112 including, e.g., semiconductor nitride, come in contact with a channel layer 114 used, e.g., a semiconductor channel, a stress may be applied to the channel layer 114.

According to an exemplary embodiment, third insulating materials 112b may be provided between the first insulating materials 112 including semiconductor nitride and the pillars 113 including the channel layer 114. For example, the first insulating materials 112 may be isolated from other first insulating materials 112 by the third insulating materials 112b to, e.g., reduce the possibility of and/or prevent a stress from being applied to the channel layer 114. Thus, reliability of a nonvolatile memory device, e.g., device 100 in FIG. 1, may be enhanced.

Figure 18:
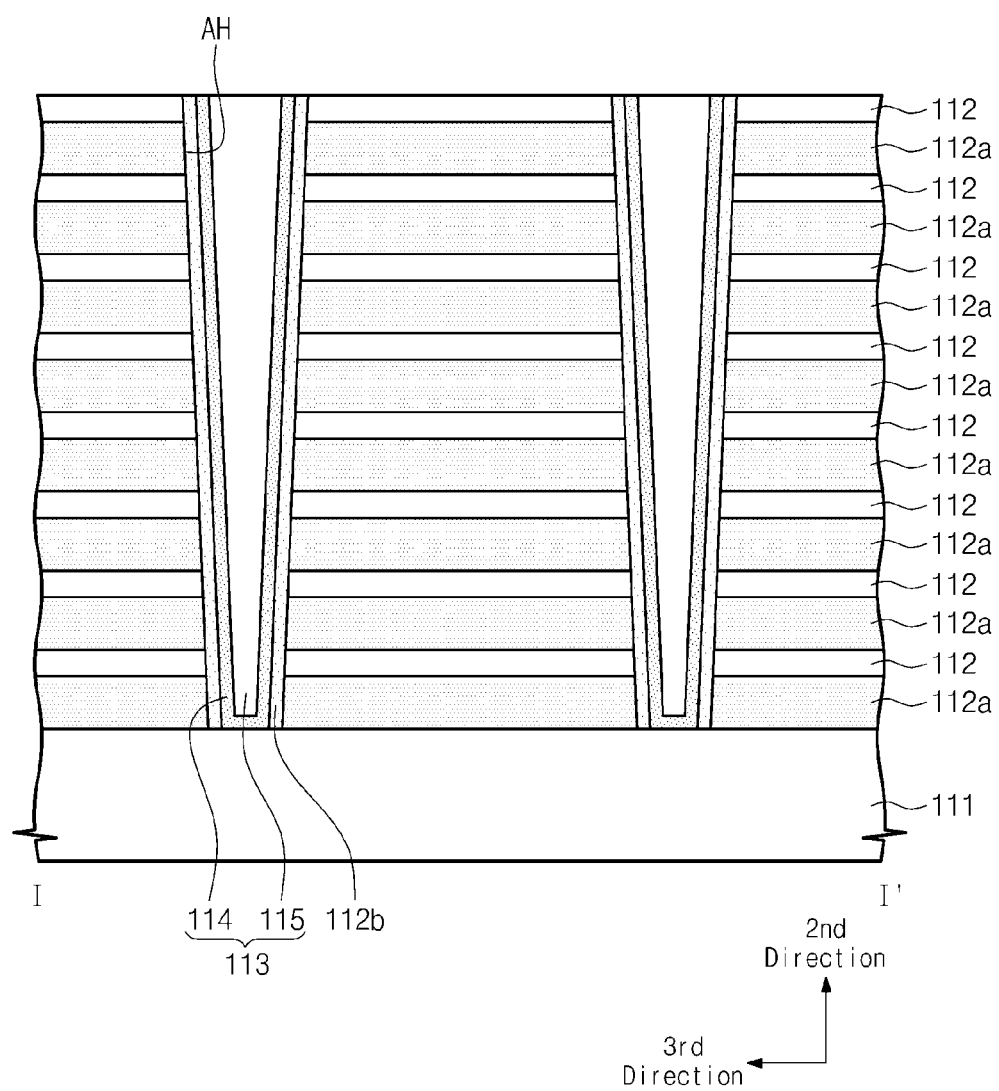
FIGS. 18 and 20 illustrate cross-sectional views depicting stages in an exemplary method of forming a memory block described with reference to FIGS. 3 and 17.
Figure 20:
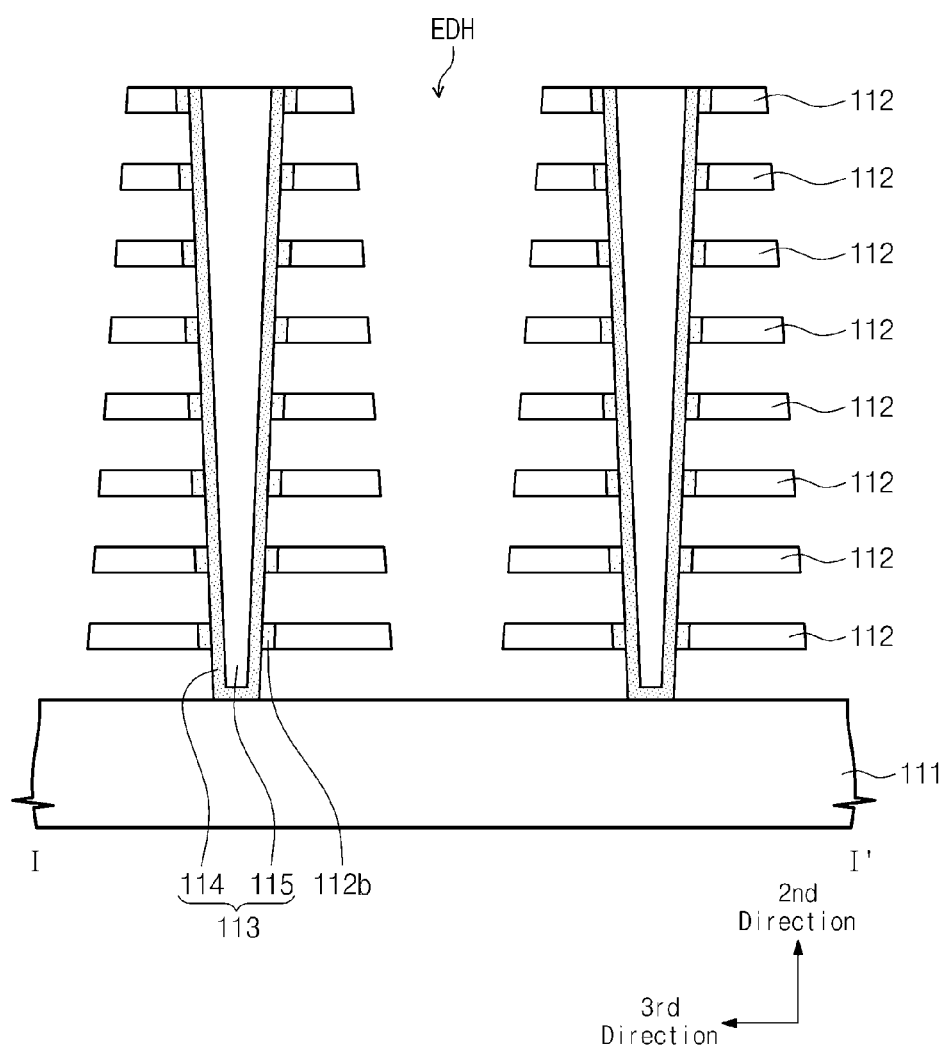

FIGS. 18 and 20 illustrate cross-sectional views depicting stages in a procedure of forming the memory block BLK1 described with reference to FIGS. 3 and 17. Referring to FIG. 18, second insulating materials 112a and first insulating materials 112 may be alternately stacked on a substrate 111 to form a stacked structure. For example, the second insulating material 112a may be stacked on, e.g., directly on, the substrate 111, and the first insulating material 112 may be stacked on the second insulating material 112a. Thereafter, the first insulating material 112 may be stacked on the second insulating material 112a, and the second insulating material 112a may be stacked on the first insulating material 112. The second insulating materials 112a and the first insulating materials 113 may be alternately stacked to a specific height. According to an exemplary embodiment, the second insulating materials 112a may include, e.g., a semiconductor oxide, and the first insulating materials 112 may include, e.g., a semiconductor nitride.

Active holes AH may be formed through the first and second insulating materials 112 and 112a in a direction perpendicular to the substrate 111. The active holes AH may be formed to expose the substrate 111.

Third insulating materials 112b may be formed, e.g., conformally formed, on inner surfaces of the active holes AH. The third insulating materials 112b may include, e.g., the same material as the second insulating materials 112a. For example, the third insulating materials 112b may include a semiconductor oxide.

Thereafter, bottom portions of the third insulating materials 112b may be removed. For example, the bottom portions of the third insulating materials 112b may be removed to expose a top surface of the substrate 111.

Channel layers 114 may be formed on the inner side surfaces of the third insulating materials 112b and bottom surfaces of the active holes AH, respectively. Inner materials 115 may be provided in the channel layers 114, e.g., to fill the active holes AH including the channel layers 114. A channel layer and an inner material in a specific active hole may constitute a pillar. That is, the channel layers 114 and the inner materials 115 may constitute pillars 113, respectively.

Figure 19:
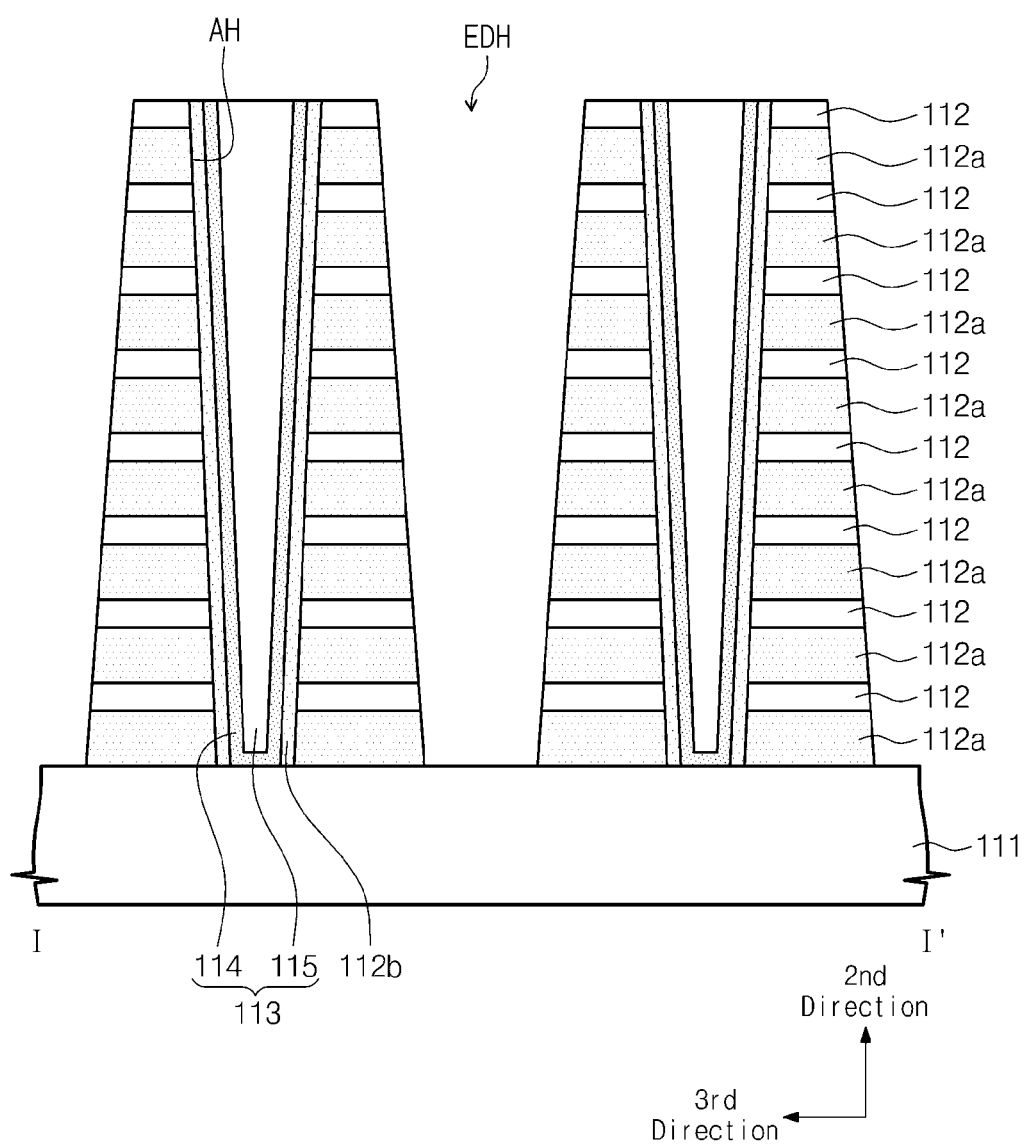

Referring to FIG. 19, electrode dividing holes EDH may be formed through the first and second insulating materials 112 and 112a in a direction perpendicular to the substrate 111. The electrode dividing holes EDH may be formed to expose the substrate 111. The electrode dividing holes EDH may extend between the pillars 113 in a first direction. That is, the electrode dividing holes EDH may divide the first and second insulating materials 112 and 112a in the first direction. From another standpoint, the electrode dividing holes EDH may divide the pillars 113.

Referring to FIG. 20, among the first and second insulating materials 112 and 112a, the second insulating materials 112 may be selectively removed. For example, the second insulating materials 112a may be removed by injecting a material having an etching selectivity with respect to the first and second insulating materials 112 and 112a through the electrode dividing holes EDH. Thus, a top surface of the substrate 111, outer side surfaces of the pillars 113, top surfaces and bottom surfaces of the first insulating materials 112, and side surfaces of the first insulating materials 112 facing the pillars 113 may be exposed.

The third insulating materials 112b may include the same material as the second insulating materials 112a. A part of the second insulating materials 112b may be removed at the same time as the second insulating materials 112a are removed. For example, during the process of removing the second insulating materials 112a, portions between the second insulating materials 112a of the third insulating materials 112b and the pillars 113 may be removed. For example, after the second insulating materials 112a are removed, the portion between the second insulating materials 112a of the third insulating materials 112b and the pillars 113 may be removed.

If the portion between the second insulating materials 112a of the third insulating materials 112b and the pillars 113 is removed, the third insulating materials 112b may remain between the first insulating materials 112 and the pillars 113.

Thereafter, as described with reference to FIGS. 11 to 13, information storage layers may be formed, e.g., conformally formed, a conductive layer CM may be removed, a planarization process may be performed, and a wordline cut WL Cut may be formed. And then, doping regions 311-313 may be formed, drains 320 may be formed, and bitlines BL1 and BL2 may be formed so that the structure illustrated in FIG. 14 may be achieved.

Figure 21:
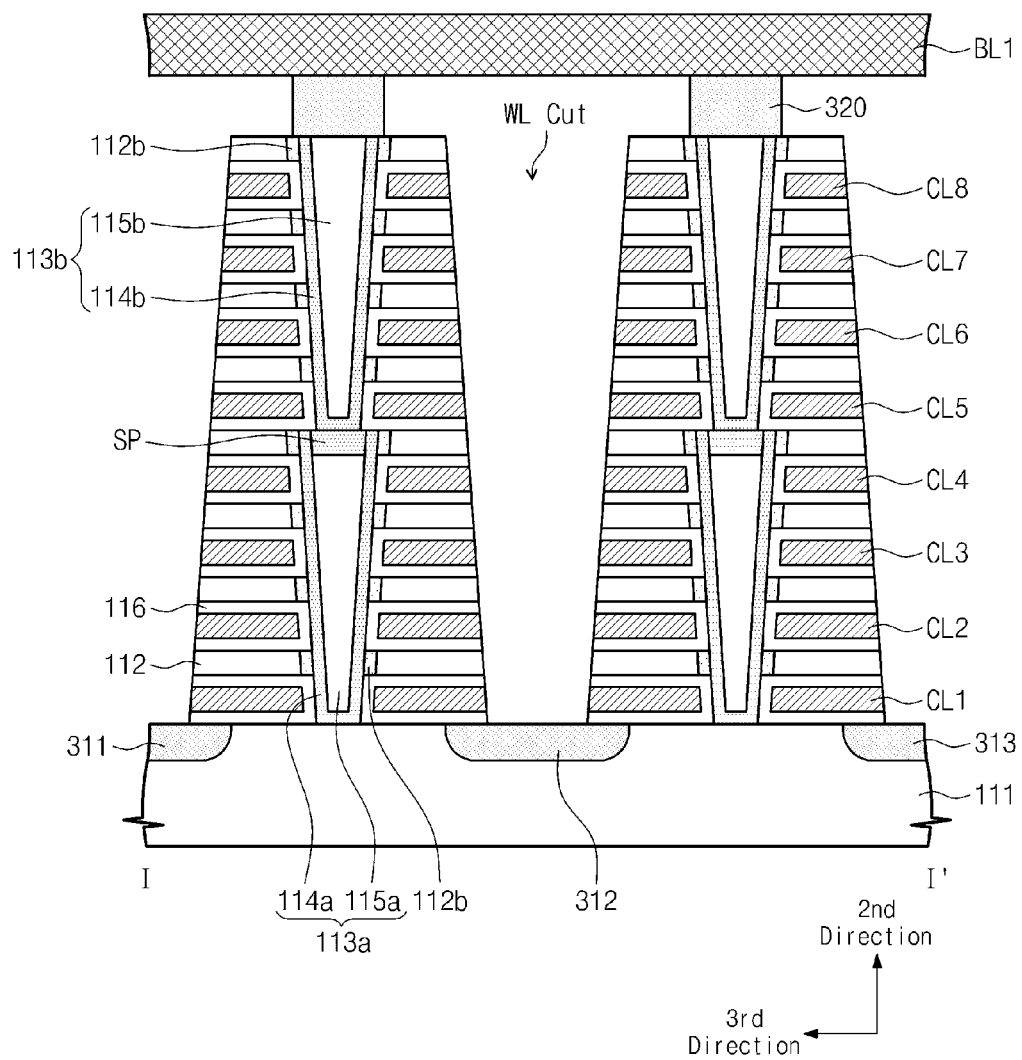
FIG. 21 illustrates another exemplary embodiment of a cross-sectional view taken along the line I-I' in FIG. 3.

FIG. 21 illustrates another exemplary embodiment of a cross-sectional view taken along the line I-I' in FIG. 3. As illustrated in FIG. 21, according to the exemplary embodiment, that pillars 113 may include first sub-pillars 113a and second sub-pillars 113b on the first sub-pillars 113a, and third insulating materials 112b may be formed adjacent to the first sub-pillars 113a and the second sub-pillars 113b. The structure shown in FIG. 21 may similar to that described with reference to FIGS. 14 and 17.

First insulating materials 112 may be provided between conductive materials CL1-CL8 have negative characteristics. Third insulating materials 112b may be provided between the insulating materials 112 and first and second sub-pillars 113a and 113b. Thus, reliability of a nonvolatile memory device, e.g., device 100 in FIG. 1, may be enhanced.

First channel layers 114a of the first sub-pillars 113a may include the same material as the channel layers 114 described with reference to, e.g., FIG. 17. Second channel layers 114b of the second sub-pillars 113b may include the same material as the channel layers 114 described with reference to, e.g., FIG. 17.

First inner materials 115a of the first sub-pillars 113a may include the same material as the inner materials 115 described with reference to, e.g., FIG. 17. Second inner materials 115b of the second sub-pillars 113b may include the same material as the inner materials 115 described with reference to, e.g., FIG. 17.

Semiconductor pads SP may be provided on the first sub-pillars 113a, respectively. First channel layers 114a of the first sub-pillars 113a and second channel layers 114b of the second sub-pillars 113b may be connected to each other through the semiconductor pads SP, respectively.

Among the conductive materials CL1-CM8, conductive materials having a height corresponding to that of the semiconductor pads SP, e.g., the fourth conductive pads CL4, the fifth conductive pad CL5, or the fourth and fifth conductive pads CL4 and CL5 may be used with and/or as dummy wordlines DWL.

The structure shown in FIG. 21 may be formed through similar steps as described with reference to FIGS. 15 and 16, except additional stages of, e.g., conformally forming third insulating materials 112b on inner surfaces of first and second active holes AH1 and AH2 and recessing bottom portions of the third insulating materials 112b may be performed.

Figure 22:
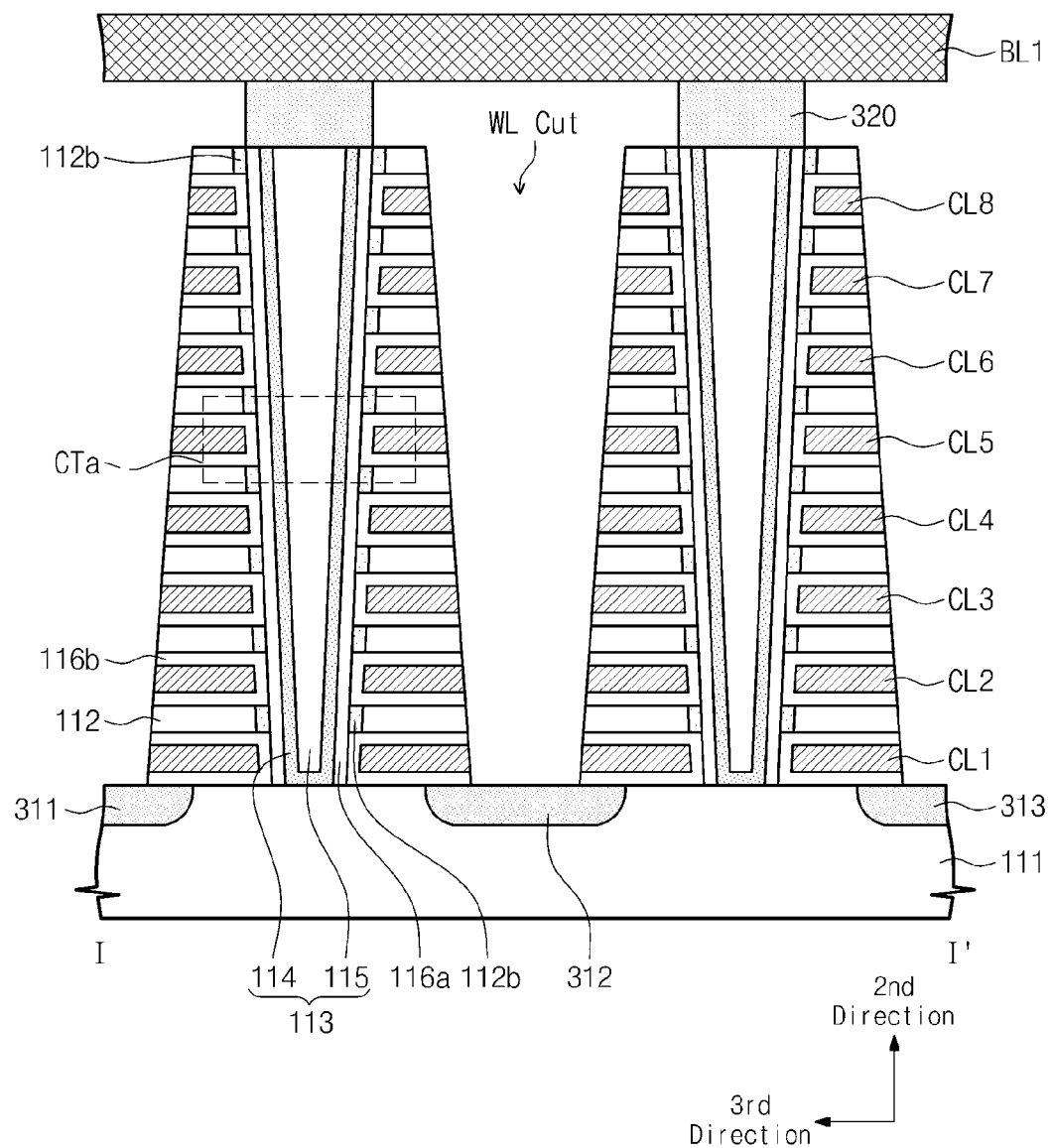
FIG. 22 illustrates another exemplary embodiment of a cross-sectional view taken along the line I-I' in FIG. 3.

FIG. 22 illustrates another exemplary embodiment of a cross-sectional view taken along the line I-I' in FIG. 3. Referring to FIGS. 3 and 22, the memory block BLK1 includes structures extending in first to third directions.

The structure shown in FIG. 22 is similar to that described with reference to FIG. 17, except that first information storage layers 116a may be provided on outer side surfaces of the pillars 113, e.g., outer surfaces of the channel layers 114, and second information storage layers 116b may be provided on top and bottom surfaces of conductive materials CL1-CL8 and adjacent side surfaces of pillars 113.

According to an exemplary embodiment, first insulating layers 112 provided between the conductive materials CL1-CL8 may have negative characteristics. Third insulating materials 112b may be provided between the first insulating materials 112 and the pillars 113. Thus, reliability of a nonvolatile memory device, e.g., device 100 in FIG. 1, may be enhanced.

Figure 23:
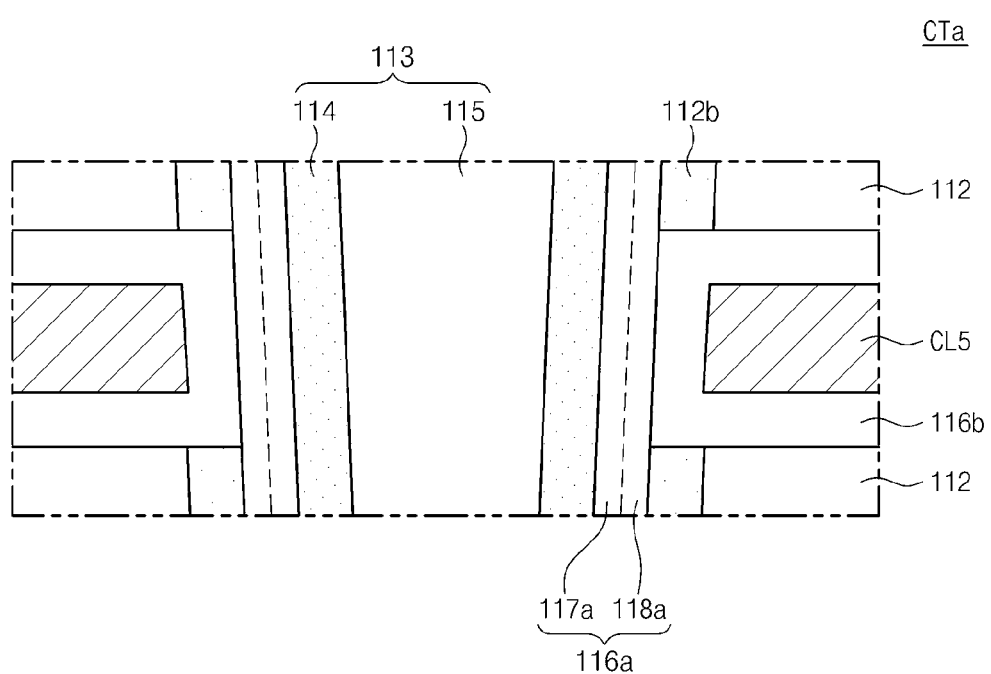
FIG. 23 illustrates an enlarged view of a cell transistor in FIG. 22.

FIG. 23 illustrates an enlarged view of a cell transistor CTa in FIG. 22. Referring to FIGS. 3, 22, and 23, a cell transistor CTa may include a region of pillars 113 adjacent to a fifth conductive material CL5 and first and second conductive storage layers 116a and 116b provided between the fifth conductive material CL5 and the pillars 113.

The first storage information layer 116a may be provided on outer side surfaces of the pillars 113. The first information storage layer 116a may include a first sub layer 117a and a second sub layer 118a. The first sub layer 117a may include, e.g., a thermal oxide and/or a semiconductor oxide. The second sub layer 118a may include a semiconductor nitride and/or a metal oxide (e.g., aluminum oxide, hafnium oxide, etc.).

The second information storages 116b may extend between conductive materials CL1-CL8 and the pillars 113. For example, the second information storages 116b may extend onto, e.g., extend across, top and bottom surfaces of the conductive materials CL1-CL8 from between the conductive materials CL1-CL8 and the first information storage layers 116a.

A channel layer 114 may act as a vertical body. The first sub layer 117a may act a tunneling insulating layer. The second sub layer 118a may act as a blocking insulating layer. The fifth conductive material CL5 may act as a gate or a control gate.

For example, the fifth conductive material CL5 acting as a gate (or control gate), the second information storage layer 116b acting as a blocking insulating layer, the second sub layer 118 acting as a charge storage layer, the first sub layer 117 acting as a tunneling insulating layer, and the channel layer 114 acting as a vertical body together may act as a cell transistor.

Figure 24:
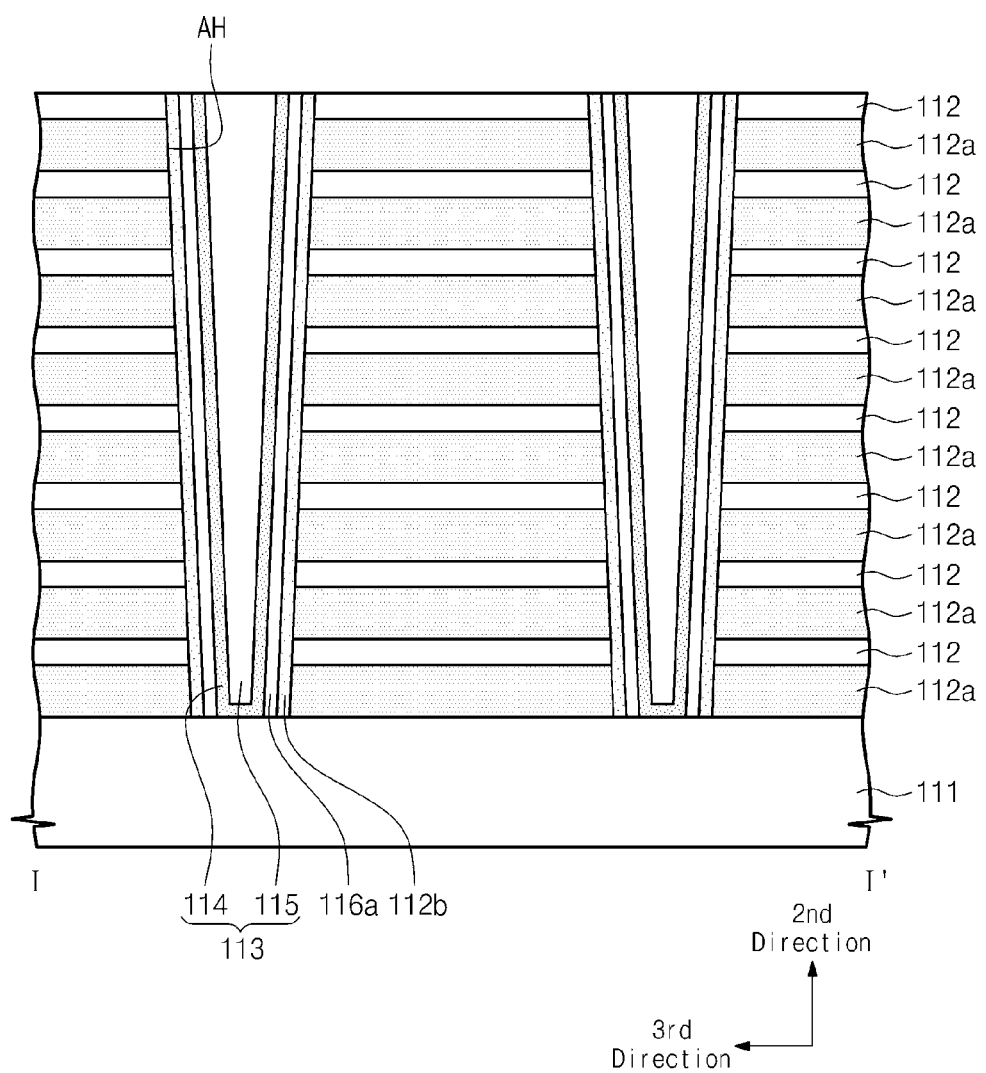
FIGS. 24 to 26 illustrate cross-sectional views depicting stages in an exemplary method of forming a memory block described with reference to FIGS. 3 and 22.
Figure 25:
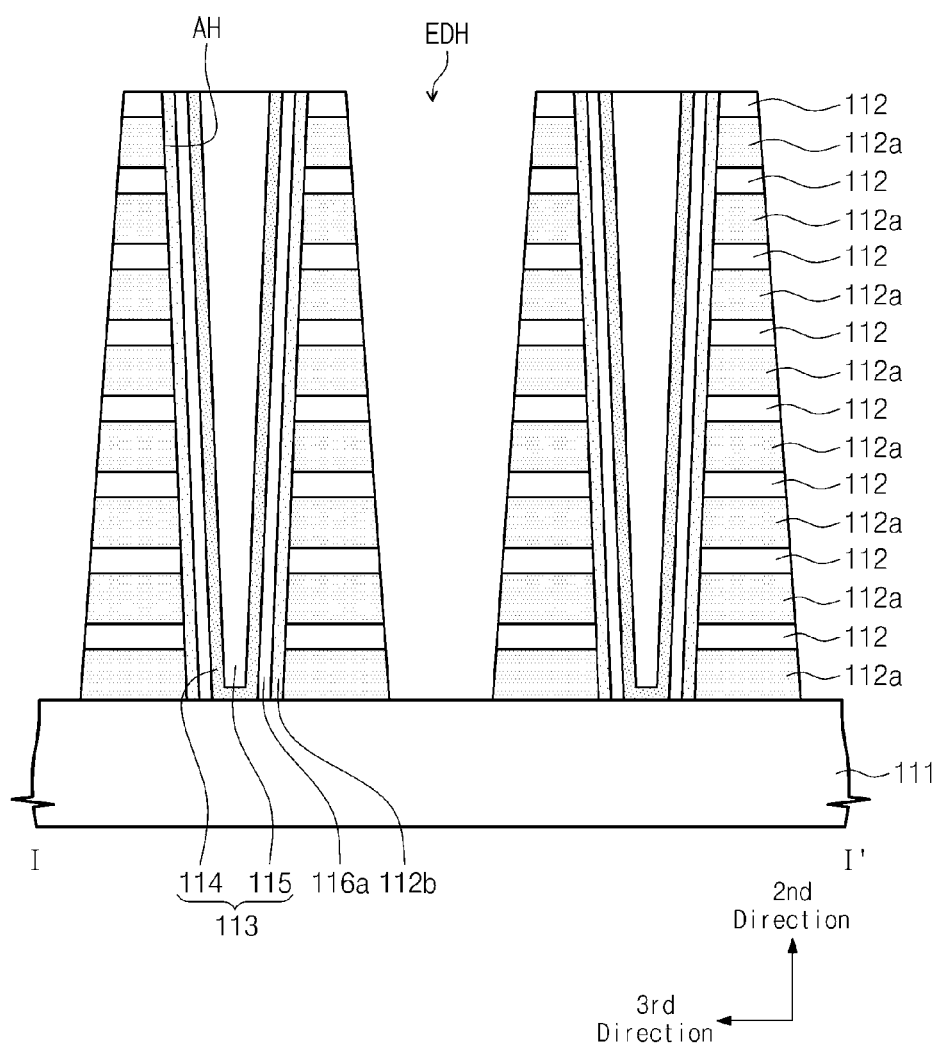
Figure 26:
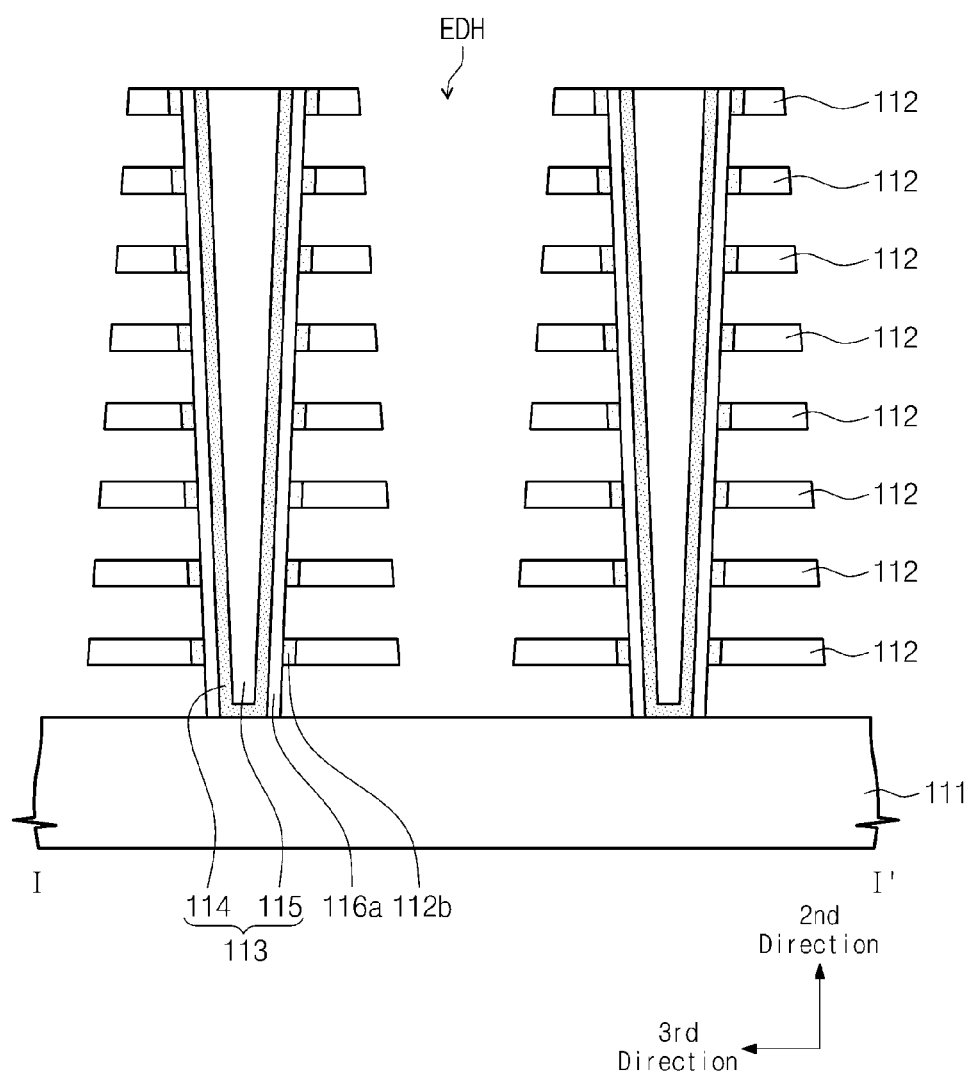

FIGS. 24 to 26 illustrate cross-sectional views of a procedure of forming the memory block BLK1 described with reference to FIGS. 3 and 22. Referring to FIG. 24, second insulating materials 112a and first insulating materials 112 may be alternately stacked on a substrate 111. For example, the second insulating material 112a may be stacked on, e.g., directly on, the substrate 111 and the first insulating layer 112 may be stacked on the second insulating material 112a. Thereafter, the first insulating layer 112 may be stacked on the second insulating material 112a, and the second insulating material 112a may be stacked on the first insulating layer 112. The second insulating materials 112a and the first insulating materials 112 may be alternately stacked to a specific height. According to an exemplary embodiment, the second insulating materials 112a may include, e.g., silicon oxide. The first insulating materials 112 may include, e.g., silicon nitride.

Active holes AH may be formed through the first and second insulating materials 112 and 112a in a direction perpendicular to the substrate 111. The active holes AH may be formed to expose the substrate 111.

Third insulating materials 112b may be formed, e.g., conformally, on inner surfaces of the active holes AH. The third insulating materials 112b may include the same material as the second insulating materials 112a. For example, the third insulating materials 112b may include semiconductor oxide. Thereafter, bottom portions of the third insulating materials 112b may be removed. For example, the bottom portion of the third insulating materials 112b may be removed to expose the substrate 111.

First information storage layers 116a may be conformally formed on inner side surfaces of the third insulating materials 112b and bottom surfaces of the active holes AH. For example, a second sub layer 118a and a first sub layer 117a may be sequentially and conformally formed. Thereafter, bottom portions of the first information storage layers 116a may be recessed. For example, the bottom portions of the third insulating materials 112b may be recessed to expose the substrate 111.

Channel layers 114 may be conformally formed on inner side surfaces of the first information storage layers 116a and the bottom surfaces of the active holes AH. Inner materials 115 may be provided in the channel layers 114. A channel layer and an inner material in a specific active hole may constitute a pillar. For example, the channel layer 114 and the inner materials 115 may constitute pillars 113, respectively.

Referring to FIG. 25, electrode dividing holes EDH may be formed through the first and second materials 112 and 112a in a direction perpendicular to the substrate 111. The electrode dividing holes EDH may be formed to expose the substrate 111. The electrode dividing holes EDH may extend between the pillars 113 in a first direction. For example, the electrode dividing holes EDH may divide the first and second insulating materials 112 and 112a in the first direction. From another standpoint, the electrode dividing holes EDH may divide the pillars 113.

Referring to FIG. 26, the second insulating materials 112a may be selectively removed among the first and second insulating materials 112 and 112a. For example, the second insulating materials 112a may be removed by injecting a material having an etching selectivity with respect to the first and second insulating materials 112 and 112a through the electrode dividing holes EDH. Thus, a top surface of the substrate 111, outer side surfaces of the pillars 113, top surfaces and bottom surfaces of the first insulating materials 112, and side surfaces of the first insulating materials 112 facing the pillars 113 may be exposed.

Thereafter, as described with reference to FIGS. 11 to 13, second information storage layers 116b may be formed, e.g., conformally formed, a conductive layer CM may be formed, a planarization process may be performed, and a wordline cut WL Cut may be formed. And then, doping regions 311-313 may be formed, drains 320 may be formed, and bitlines BL1 and BL2 may be formed so that the structure illustrated in FIG. 22 may be achieved.

Figure 27:
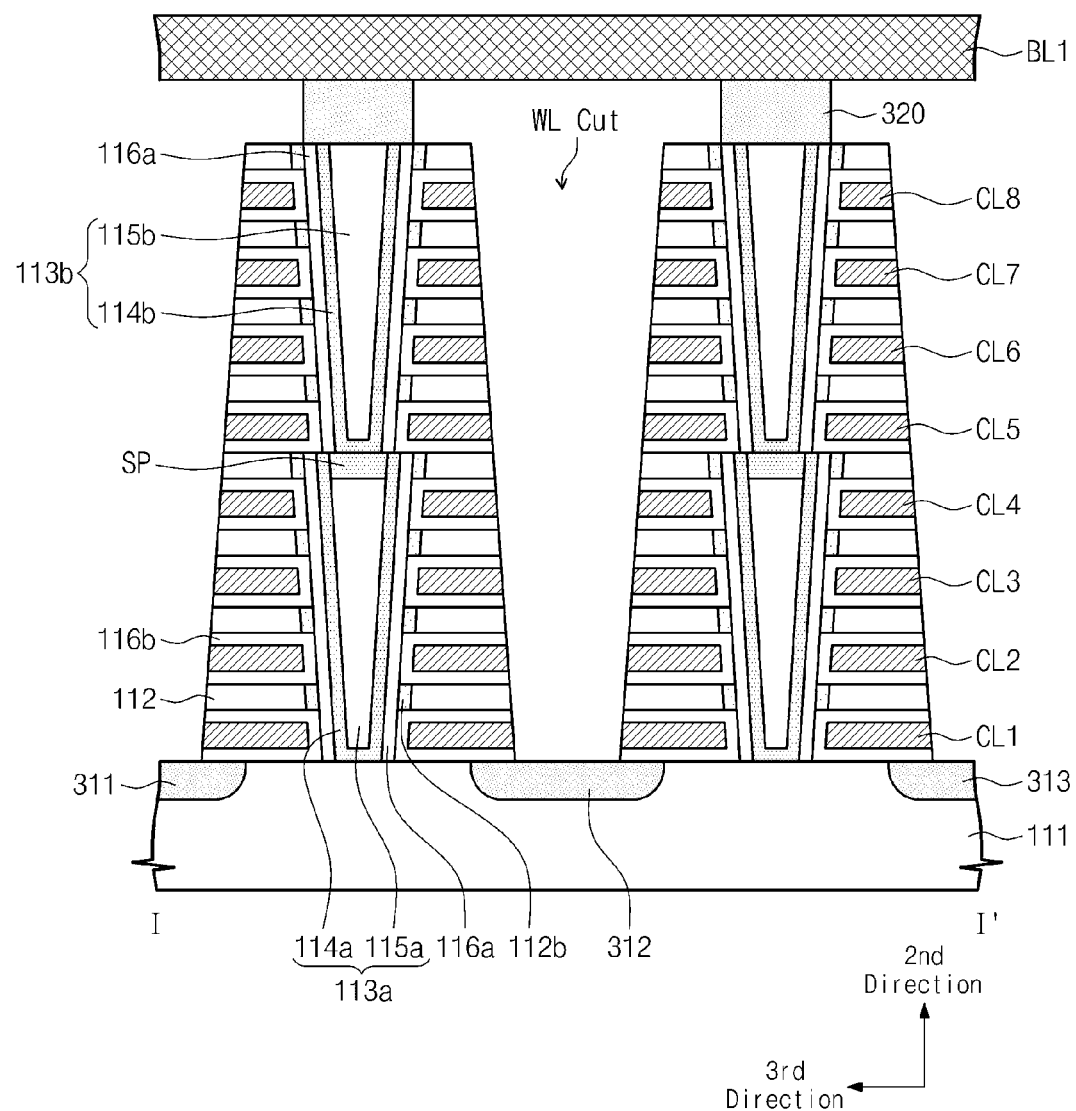
FIG. 27 illustrates another exemplary embodiment of a cross-sectional view taken along the line I-I' in FIG. 3.

FIG. 27 illustrates another exemplary embodiment of a cross-sectional view taken along the line I-I' in FIG. 3. The structure shown in FIG. 27 is similar to that described with reference to FIG. 22, except pillars include first sub-pillars 113a and second sub-pillars 113b.

First insulating materials 112 provided between conductive materials CL1-CL8 may have negative characteristics. Third insulating materials 112b may be provided between the first insulating materials 112 and the first and second sub-pillars 113a and 113b. Thus, reliability of a nonvolatile memory device, e.g., device 100 in FIG. 1, may be enhanced.

First channel layers 114a of the first sub-pillars 113a may include the same material as the channel layers 114 described with reference to, e.g., FIG. 22. Second channel layers 114b of the second sub-pillars 113b may include the same material as the channel layers 114 described with reference to, e.g., FIG. 22.

First inner materials 115a of the first sub-pillars 113a may include the same material as the inner materials 115 described with reference to, e.g., FIG. 22. Second inner materials 115b of the second sub-pillars 113b may include the same material as the inner materials 115 described with reference to, e.g., FIG. 22.

Semiconductor pads SP may be provided on the first sub-pillars 113a, respectively. First channel layers 114a of the first sub-pillars 113a and second channel layers 114b of the second sub-pillars 113b may be connected to each other through the semiconductor pads SP, respectively.

Among the conductive materials CL1-CM8, conductive materials having a height corresponding to that of the semiconductor pads SP, e.g., the fourth conductive pads CL4, the fifth conductive pad CL5, or the fourth and fifth conductive pads CL4 and CL5 may be used as dummy wordlines DWL.

The structure shown in FIG. 27 may be formed through similar steps as described with reference to FIGS. 15 and 16, except for additional steps of, e.g., conformally forming third insulating materials 112b on inner surfaces of first and second active holes AH1 and AH2, recessing bottom portions of the third insulating materials 112b, conformally forming first information storage layers 116a on bottom surfaces of the first and second active holes AH1 and AH2, and recessing bottom portions of the first information storage layers 116a.

Figure 28:
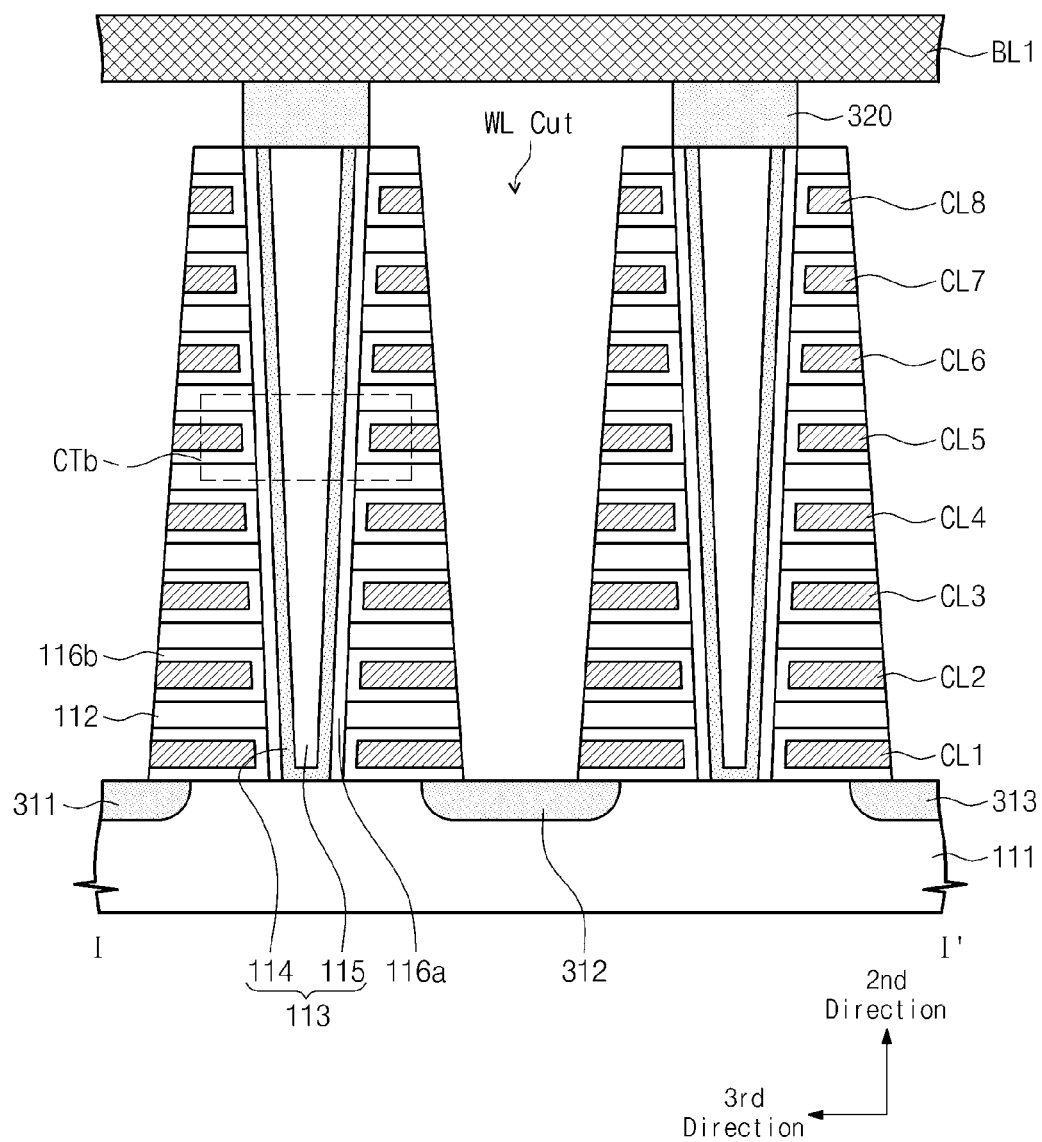
FIG. 28 illustrates another exemplary embodiment of a cross-sectional view taken along the line I-I' in FIG. 3.

FIG. 28 illustrates another exemplary embodiment of a cross-sectional view taken along the line I-I' in FIG. 3. Referring to FIGS. 3 and 28, the memory block BLK1 may include structures extending in first to third directions.

The structure shown in FIG. 28 is similar to that described with reference to FIG. 4, except that first information storage layers 116a are provided on outer side surfaces of the pillars 113 and second information storage layers 116b are provided on top and bottom surfaces of the conductive materials CL1-CL8 and adjacent side surfaces of the pillars 113.

Figure 29:
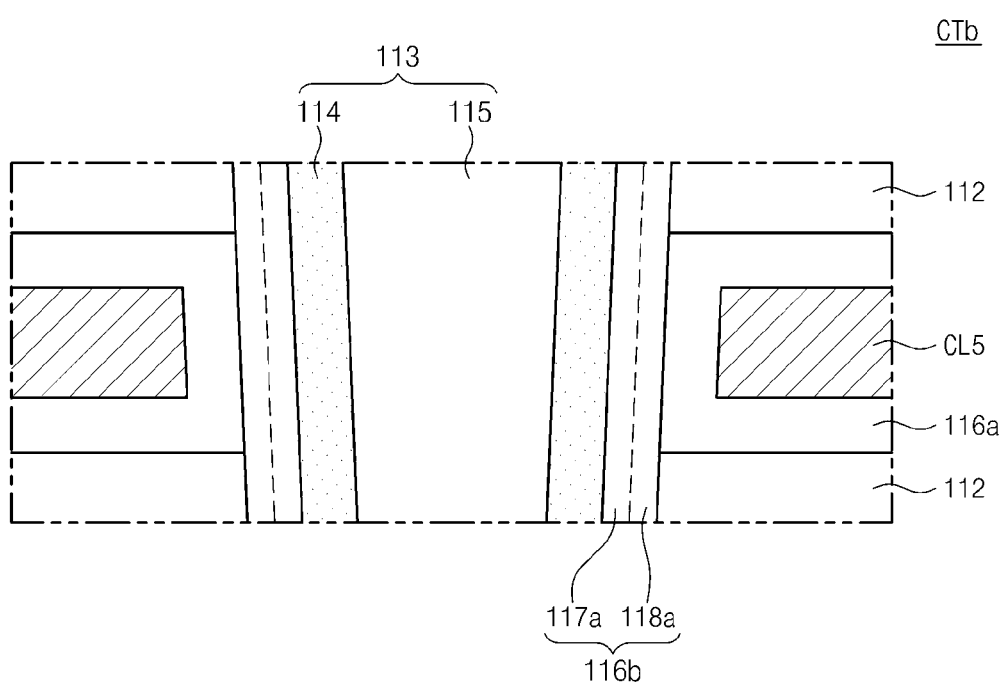
FIG. 29 illustrates an enlarged view of a cell transistor in FIG. 28.

FIG. 29 illustrates an enlarged view of a cell transistor CTb in FIG. 28. Referring to FIGS. 3, 28, and 29, the cell transistor CTb may include a fifth conductive material CL5, a region of pillars 113 adjacent to the fifth conductive material CL5, and the first and second information storage layers 116a and 116b provided between the fifth conductive material CL5 and the pillars 113.

The first information storage layers 116a may be provided on outer side surfaces of the pillars 113. The first information storage layers 116a may include a first sub layer 117a and a second sub layer 118a. The first sub layer 117a may include, e.g., a thermal oxide and/or a semiconductor oxide. The second sub layer 118a may include a semiconductor nitride and/or a metal oxide (e.g., aluminum oxide, hafnium oxide, etc.).

The second information storages 116b may extend between conductive materials CL1-CL8 and the pillars 113. For example, the second information storages 116b may extend onto top and bottom surfaces of the conductive materials CL1-CL8 from between the conductive materials CL1-CL8 and the first information storage layers 116a. The second information storage layer 116b may include a semiconductor oxide.

A channel layer 114 may act as a vertical body. The first sub layer 117a may act a tunneling insulating layer. The second sub layer 118a may act as a charge trapping layer. The second storage information layer 116b may act as a blocking insulating layer. The fifth conductive material CL5 may act as a gate or a control gate.

For example, the fifth conductive material CL5 acting as a gate (or control gate), the second information storage layer 116b acting as a blocking insulating layer, the second sub layer 118 acting as a charge trapping layer, the first sub layer 117 acting as a tunneling insulating layer, and the channel layer 114 acting as a vertical body may act as a cell transistor.

Referring to FIGS. 28 and 29, the first information storage layers 116a may be provided between the first insulating materials 112 and the pillars 113. The first information storage layers 116a may include a first sub layer 117a provided on outer side surfaces of the pillars 113 and a second sub layer 118a provided on an outer side surface of the first sub layer 117a. According to an exemplary embodiment, the first sub layer 117a includes a semiconductor oxide and the second sub layer 118a includes a semiconductor nitride. The first sub layer 117a including the semiconductor oxide may be provided between the first insulating materials 112 and the pillars 113. For example, the pillars 113 may be isolated from the second sub layer 118a and the first insulating materials 112 by the first sub layer 117a.

The first insulating materials 112 provided between the conductive materials CL1-CL8 may have negative characteristics. In addition, the first sub layer 117a may be provided between the first insulating materials 112 and the pillars 113. Thus, reliability of a nonvolatile memory device, e.g., device 100 in FIG. 1, may be enhanced.

Figure 30:
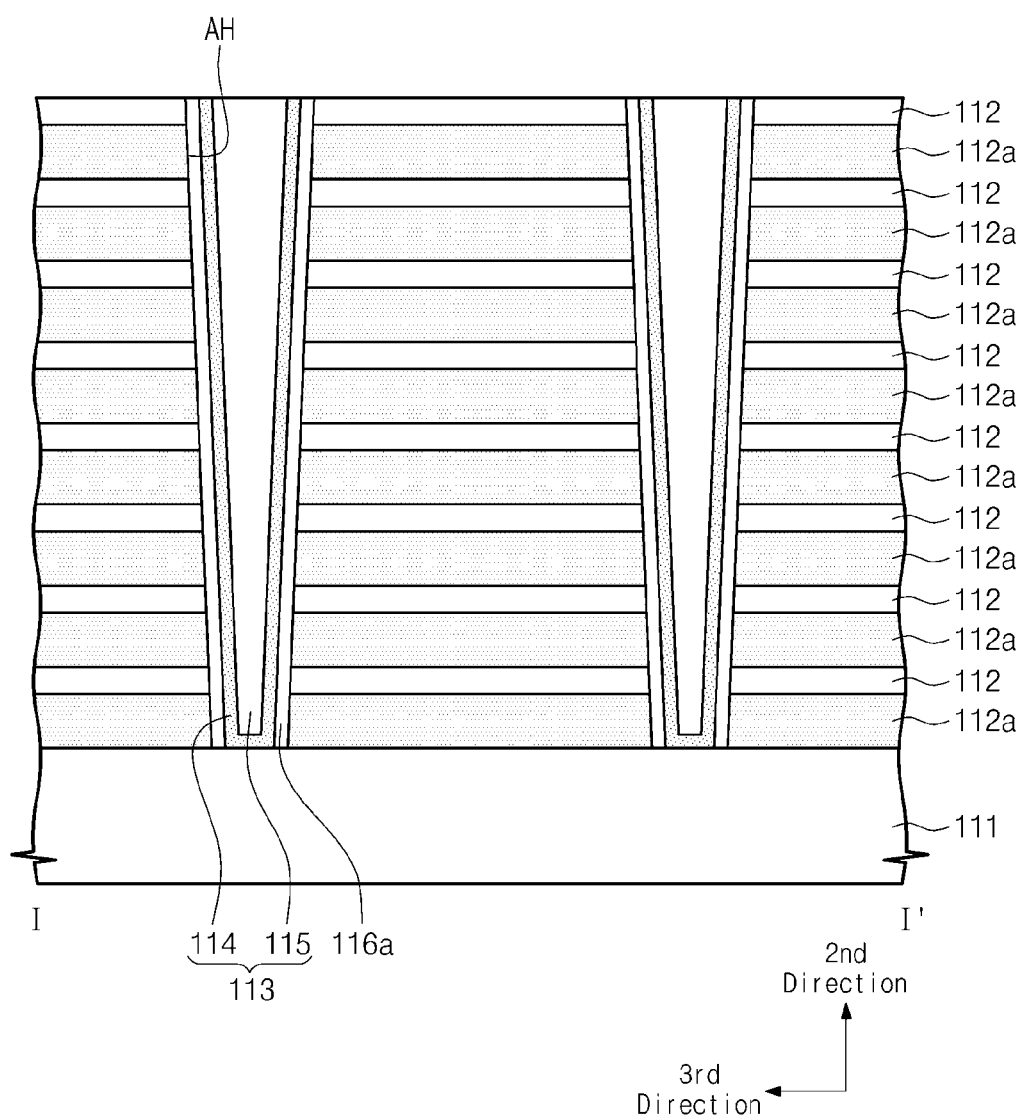
FIGS. 30 to 32 illustrate cross-sectional views depicting stages in an exemplary method of forming a memory block described with reference to FIGS. 3 and 28.
Figure 31:
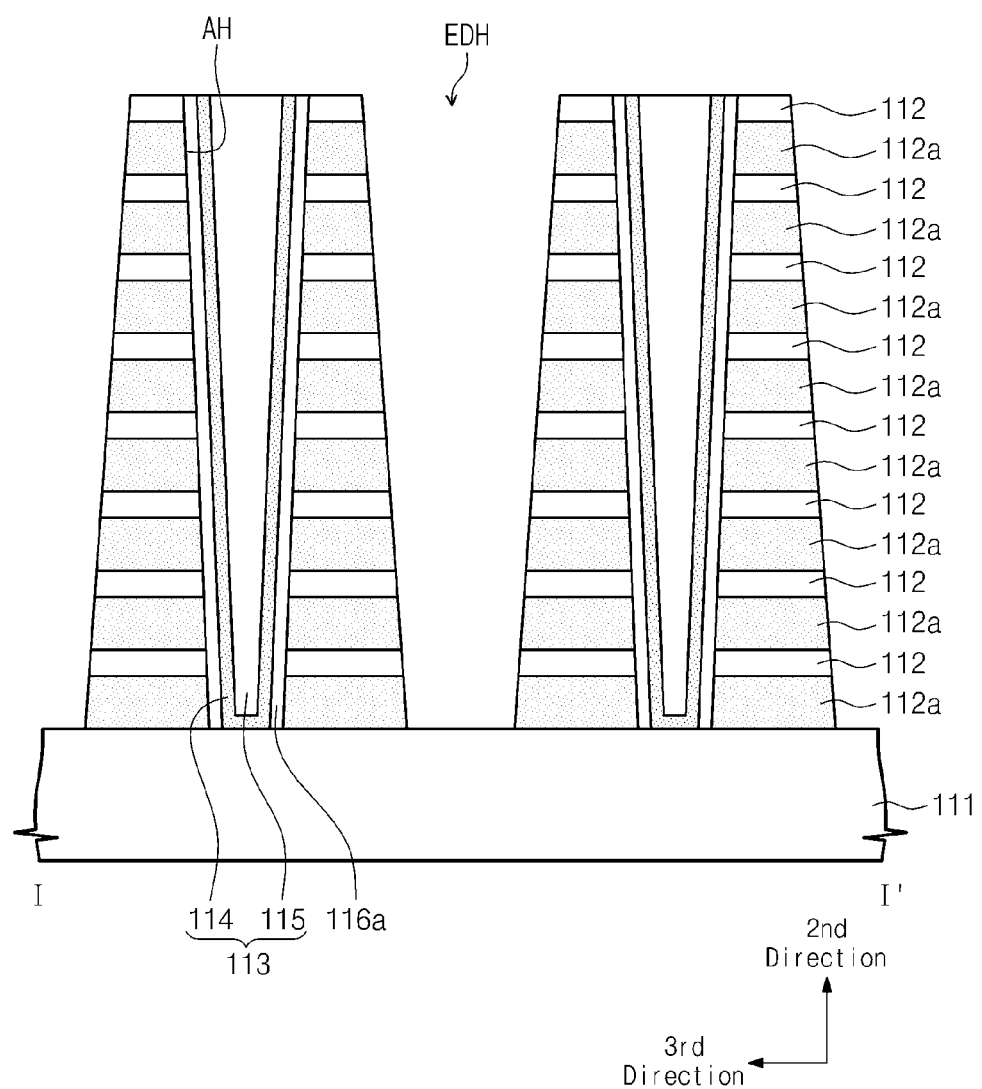
Figure 32:
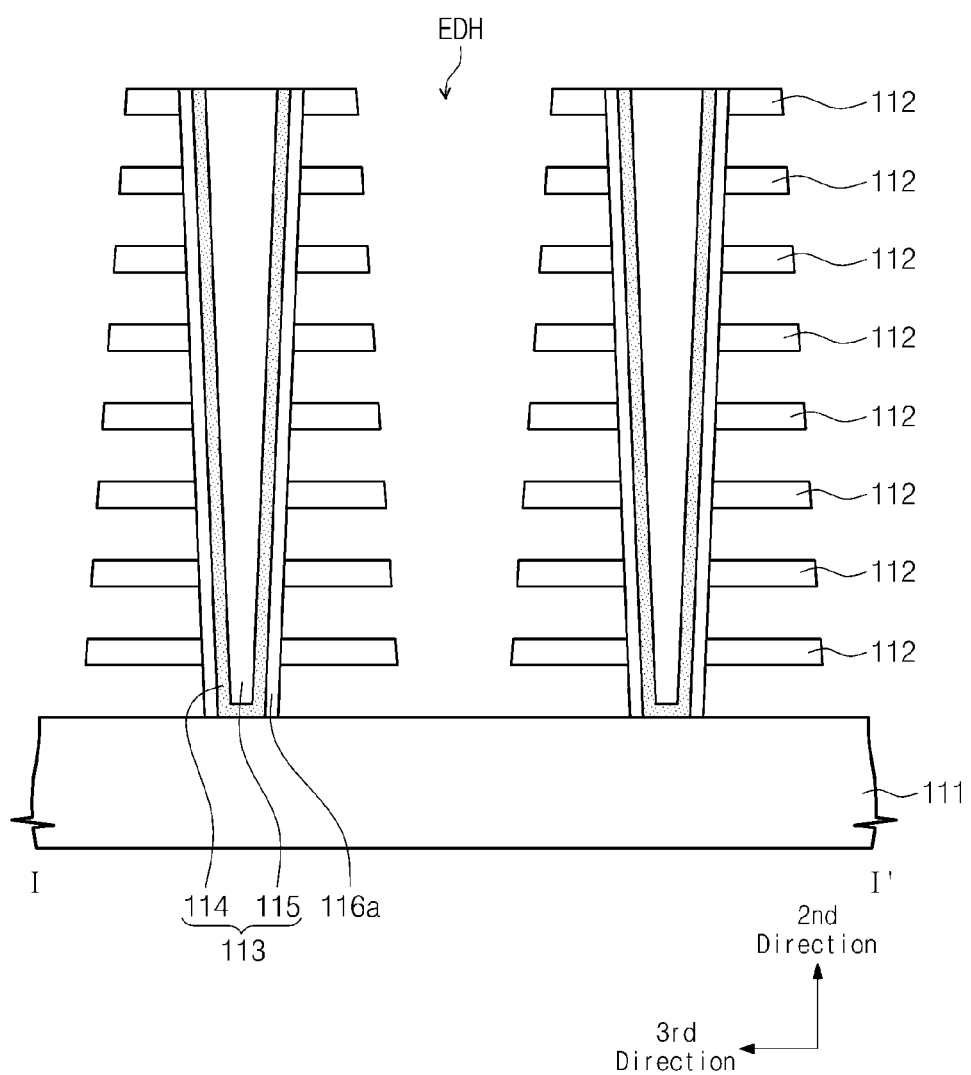

FIGS. 30 to 32 illustrate cross-sectional views of a procedure of forming the memory block BLK1 described with reference to FIGS. 3 and 28. Referring to FIG. 30, second insulating materials 112a and first insulating materials 112 may be alternately stacked on a substrate 111. For example, the second insulating material 112a may be stacked on, e.g., directly on, the substrate 111 and the first insulating layer 112 may be stacked on the second insulating material 112a. The first insulating layer 112 may be stacked on the second insulating material 112a, and the second insulating material 112a may be stacked on the first insulating layer 112. The second insulating materials 112a and the first insulating materials 112 may be alternately stacked to a specific height. The second insulating materials 112a may include a semiconductor oxide and the first insulating materials 112 may include a semiconductor nitride.

Active holes AH may be formed through the first and second insulating materials 112 and 112a in a direction perpendicular to the substrate 111. The active holes AH may be formed to expose the substrate 111.

First information storage layers 116a may be formed, e.g., conformally formed, on inner side surfaces of the active holes. For example, the second sub layer 118a and the first sub layer 117a may be sequentially and conformally formed. Thereafter, bottom portions of the first information storage layers 116a may be removed. For example, the bottom portions of the third insulating materials 112b may be removed to expose a top surface of the substrate 111.

Channel layers 114 may be conformally formed on inner side surfaces of the first information storage layers 116a and bottom surfaces of the active holes AH. Inner materials 115 may be provided in the channel layers 114. One channel layer 114 and one inner material 115 in a specific hole may constitute one pillar 113. That is, the channel layers 114 and the inner materials 115 constitute pillars 113, respectively.

Referring to FIG. 32, electrode dividing holes EDH may be formed through the first and second insulating materials 112 and 112a in the direction perpendicular to the substrate 111. The electrode dividing holes EDH may be formed to expose the substrate 111. The electrode dividing holes EDH may extend between the pillars 113 in a first direction. For example, the electrode dividing holes EDH may divide the first and second insulating materials 112 and 112a in the first direction. From another standpoint, the electrode dividing holes EDH may divide the pillars 113.

Referring to FIG. 32, the second insulating materials 112a may be selectively removed among the first and second insulating materials 112 and 112a. For example, the second insulating materials 112a may be removed by injecting a material having an etching selectivity with respect to the first and second insulating materials 112 and 112a through the electrode dividing holes EDH. Thus, a top surface of the substrate 111, outer side surfaces of the pillars 113, top surfaces and bottom surfaces of the first insulating materials 112, and side surfaces of the first insulating materials 112 facing the pillars 113 may be exposed.

Thereafter, as described with reference to FIGS. 11 to 13, second information storage layers 116b may be conformally formed, a conductive layer CM may be formed, a planarization process may be performed, and a wordline cut WL Cut may be formed. And then, doping regions 311-313 may be formed, drains 320 may be formed, and bitlines BL1 and BL2 may be formed so that the structure illustrated in FIG. 28 may be achieved.

Figure 33:
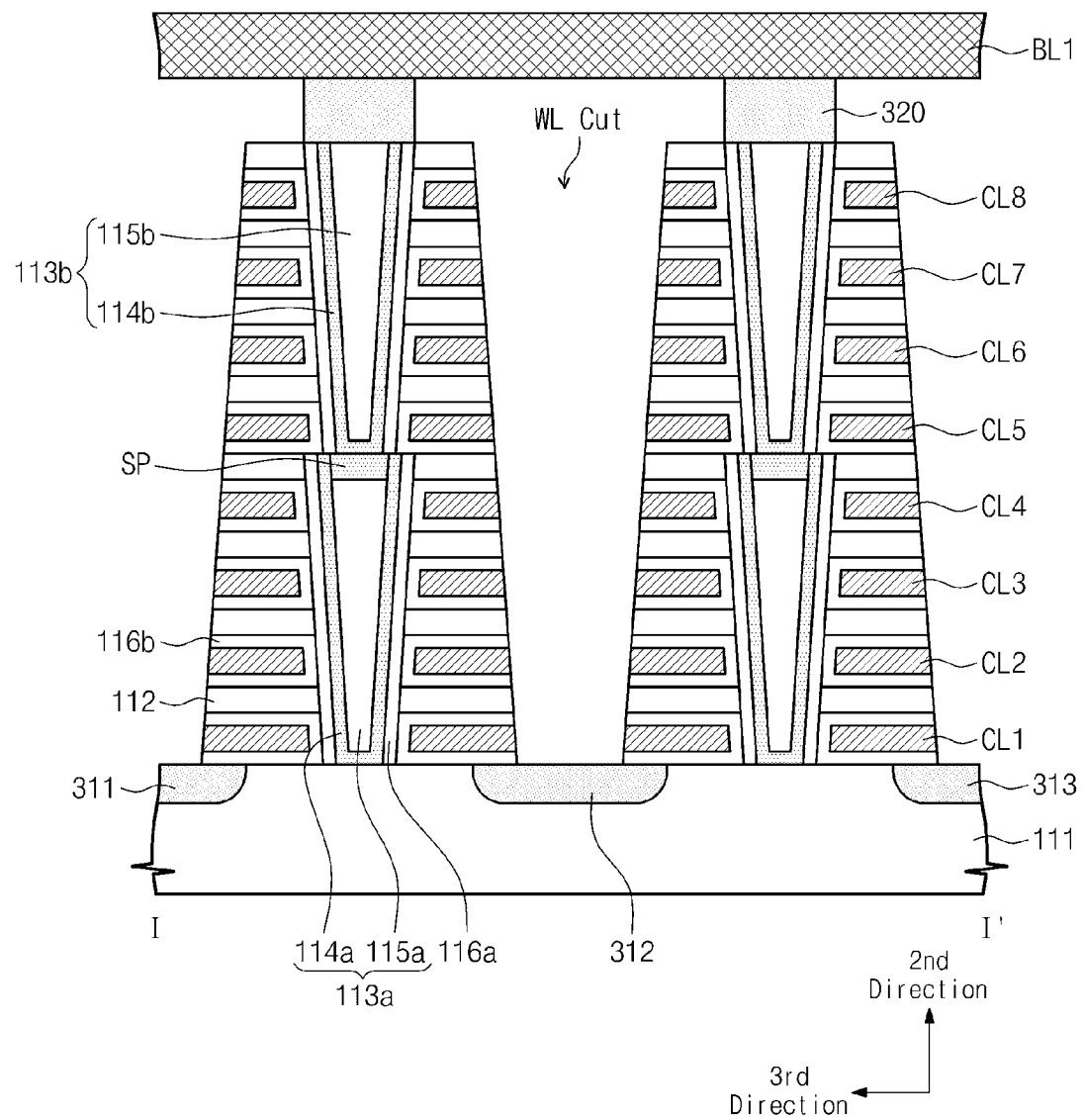
FIG. 33 illustrates another exemplary embodiment of a cross-sectional view taken along the line I-I' in FIG. 3.

FIG. 33 illustrates another exemplary embodiment of a cross-sectional view taken along the line I-I' in FIG. 3. The structure shown in FIG. 33 is similar to that described with reference to FIG. 28, except pillars includes first sub-pillars 113a and second sub-pillars 113b.

First insulating materials 112 provided between conductive materials CL1-CL8 may have negative characteristics. In addition, first information storage layers 116a may be provided between the first insulating materials 112 and first and second sub-pillars 113a and 113b. Thus, reliability of a nonvolatile memory device, e.g., device 100 in FIG. 1, may be enhanced.

First channel layers 114a of the first sub-pillars 113a may include the same material as the channel layers 114 described with reference to, e.g., FIG. 28. Second channel layers 114b of the second sub-pillars 113b may include the same material as the channel layers 114 described with reference to, e.g., FIG. 28.

First inner materials 115a of the first sub-pillars 113a may include the same material as the inner materials 115 described with reference to, e.g., FIG. 28. Second inner materials 115b of the second sub-pillars 113b may include the same material as the inner materials 115 described with reference to, e.g., FIG. 28.

Semiconductor pads SP may be provided on the first sub-pillars 113a. The first channel layers 114a of the first sub-pillars 113a and the second channel layers 114b of the second sub-pillars 113b may be connected to each other through the semiconductor pads SP, respectively.

Among the conductive materials CL1-CL8, conductive materials having a height corresponding to that of the semiconductor pads SP, e.g., the fourth conductive pads CL4, the fifth conductive pad CL5, or the fourth and fifth conductive pads CL4 and CL5 may be used as dummy wordlines DWL.

The structure shown in FIG. 33 may be formed through similar stages as described with reference to FIGS. 15 and 16, except for additional stages of e.g., forming the first information storage layers 116a on inner surfaces of first and second active holes AH1 and AH2 and recessing bottom portions of the first information storage layers 116a.

Figure 34:
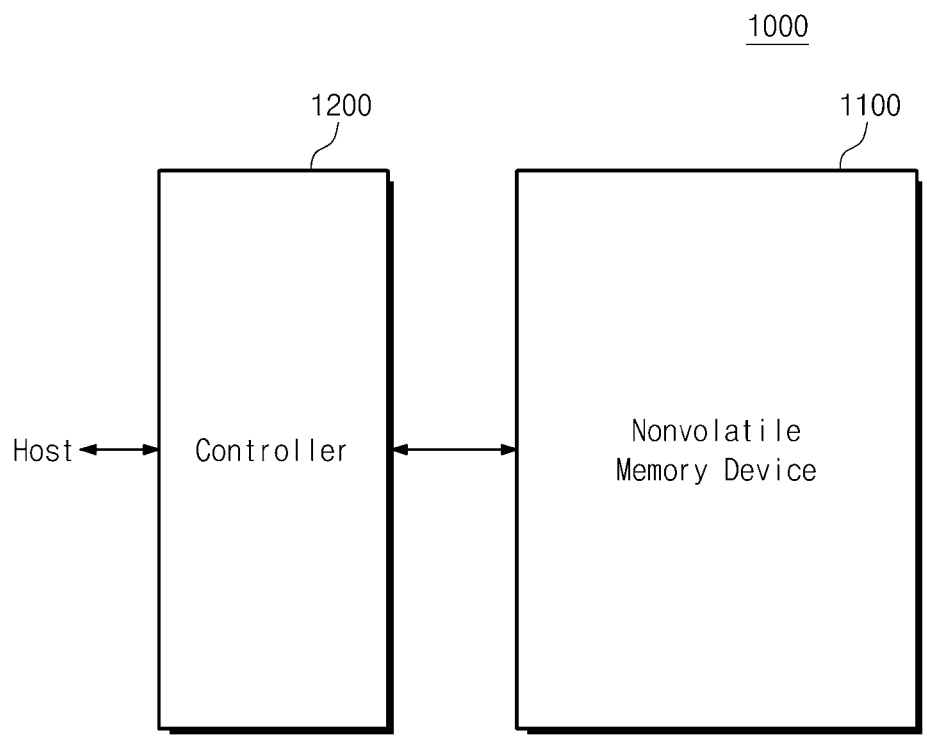
FIG. 34 illustrates a block diagram of a memory system according to an exemplary embodiment.

FIG. 34 illustrates a block diagram of a memory system 1000 according to an exemplary embodiment. As illustrated, the memory system 1000 may include a nonvolatile memory device 1100 and a controller 1200.

The nonvolatile memory device 1100 may have the same configuration as the nonvolatile memory device 100 described with reference to FIGS. 1 to 33 and may operate the same as the nonvolatile memory device 100. For example, the nonvolatile memory device 1100 may include conductive materials CL1-CL8 and first insulating materials 112 that are alternately stacked on a substrate (111 in FIGS. 3 to 33). The nonvolatile memory device 1100 may include the first insulating materials 112 having a semiconductor nitride included therein. The nonvolatile memory device 1100 may further include a semiconductor oxide provided between the first insulating materials 112 and pillars 113. The semiconductor oxide may be, e.g., may form, third insulating materials 112b or first sub materials 117a. Thus, the possibility of spreading and/or stress may be reduced and/or prevented so that, e.g., reliability of the nonvolatile memory device 1100 and reliability of the memory system 1000 including the nonvolatile memory device 1100 may be increased.

The controller 1200 may be connected to a host and the nonvolatile memory device 1100. In response to a request from the host, the controller 1200 may be configured to access the nonvolatile memory device 1100. For example, the controller 1200 may control the read, write, erase, and background operations of the nonvolatile memory device 1100. The controller 1200 may be configured to provide interface between the nonvolatile memory device 1100 and the host. The controller 1200 may be configured to drive firmware for controlling the nonvolatile memory device 1100.

The controller 1200 may be configured to supply a control signal CTRL and an address ADDR to the nonvolatile memory device 1100. The controller 1200 may be configured to exchange data DATA with the nonvolatile memory device 1100.

The controller 1200 may further include well-known elements such as, e.g., a random access memory (RAM), a processing unit, a host interface, and/or a memory interface. The RAM may be used as at least one of a working memory of the processing unit, a cache memory between the nonvolatile memory device 1100 and the host, and a buffer memory between the nonvolatile memory device 1100 and the host. The processing unit may control the overall operation of the controller 1200.

The host interface may include a protocol for data exchange between the host and the controller 1200. For example, the host interface may be configured to communicate with an external entity, e.g., a host through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol, and an Integrated Drive Electronics (IDE) protocol.

The memory system 1000 may be configured to further include an error correction block. The error correction block may be configured to detect and correct the error of data read from the nonvolatile memory device 1100 with an error correction code (ECC). For example, the error correction block may be provided as the element of the controller 1200. The error correction block may be provided as an element of the nonvolatile memory device 1100.

The controller 1200 and the nonvolatile memory device 1100 may be integrated into one semiconductor device. For example, the controller 1200 and the nonvolatile memory device 1100 may be integrated into one semiconductor device to configure a memory card. The controller 1200 and the nonvolatile memory device 1100 may be integrated into one semiconductor device to configure a memory card such as a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC), and a universal flash memory device (UFS).

The controller 120 and the nonvolatile memory device 1100 may be integrated into one semiconductor device to configure, e.g., a solid state drive (SSD). The semiconductor drive (SSD) may include a storage unit configured to store data in a semiconductor memory. When the memory system 1000 is used as the solid state drive (SSD), the operating speed of the host connected to the memory system 1000 may be dramatically improved.

As another example, the memory system 1000 may be provided as one of various elements for electronic devices such as computers, Ultra Mobile PCs (UMPCs), workstations, net-books, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices, and one of various elements configuring a computing system.

According to an exemplary embodiment, the nonvolatile memory device 1100 or the memory system 1000 may be packaged as one of various types to be subsequently embedded. For example, the nonvolatile memory device 1100 or the memory system 1000 may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 35:
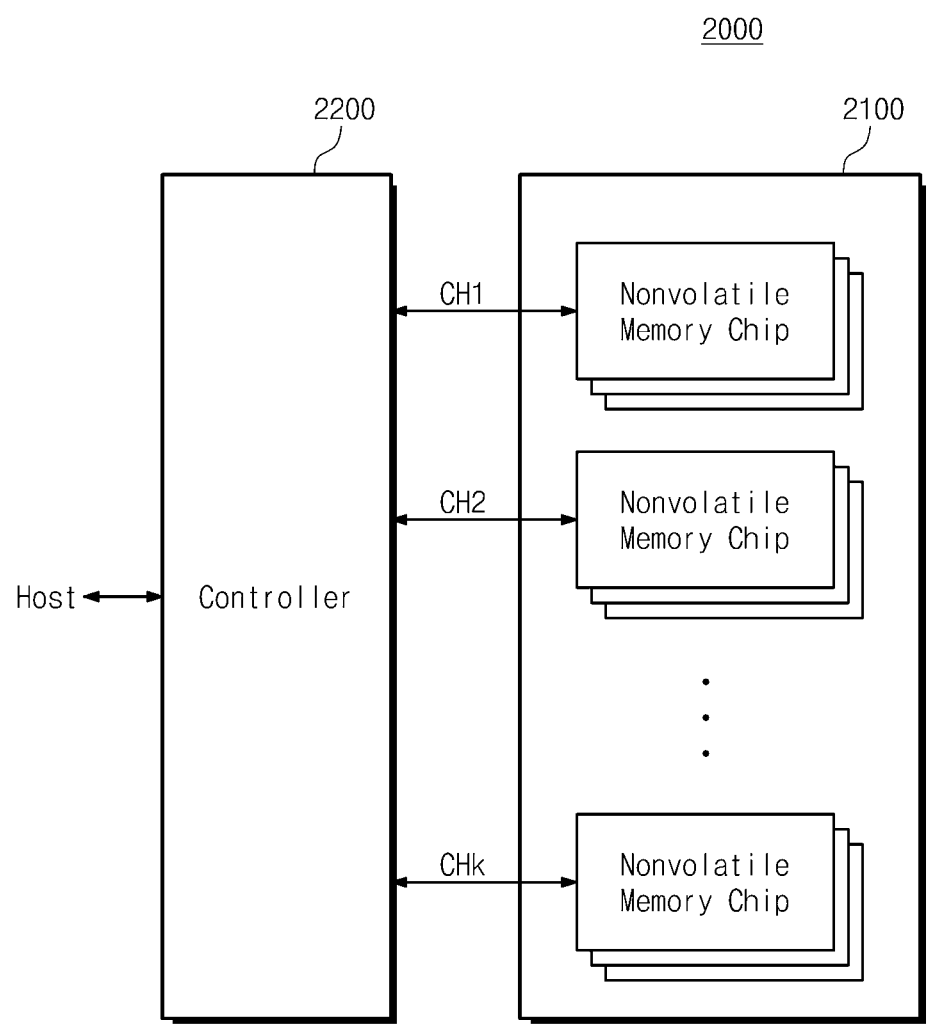
FIG. 35 illustrates a block diagram illustrating an application example of the memory system in FIG. 34.

FIG. 35 illustrates a block diagram of an application example of the memory system 1000 in FIG. 34. As illustrated, a memory system 2000 may include a nonvolatile memory device 2100 and a controller 2200. The nonvolatile memory device 2100 may include a plurality of nonvolatile memory chips. The nonvolatile memory chips may be divided into a plurality of groups. Each group of the nonvolatile memory chips may be configured to communicate with the controller 2200 through one common channel. In FIG. 33, it is illustrated that the nonvolatile memory chips may communicate with the controller 2200 through first to kth channels CH1-CHk.

Each of the nonvolatile memory chips may have a similar configuration as the nonvolatile memory device 100 described with reference to FIG. 1 and may operate the same as the nonvolatile memory device 100. For example, the nonvolatile memory chip may include conductive materials CL1-CL8 and first insulating materials 112 that are alternately stacked on a substrate (111 in FIGS. 3 to 33), and the first insulating materials 112 may include a semiconductor nitride. The nonvolatile memory chip may further include a semiconductor oxide provided between the first insulating materials 112 and pillars 113. The semiconductor oxide may be third insulating materials 112b or first sub materials 117a. Thus, the possibility of spreading and/or stress may be reduced and/or prevented to, e.g., increase the reliability of the nonvolatile memory device 1100 and reliability of the memory system 1000 including the nonvolatile memory device 1100.

In FIG. 33, it is described that a plurality of nonvolatile memory chips are connected to one channel. However, embodiments are not limited thereto. For example, it will be understood that the memory system 2000 may be modified such that one nonvolatile memory chip is connected to one channel.

Figure 36:
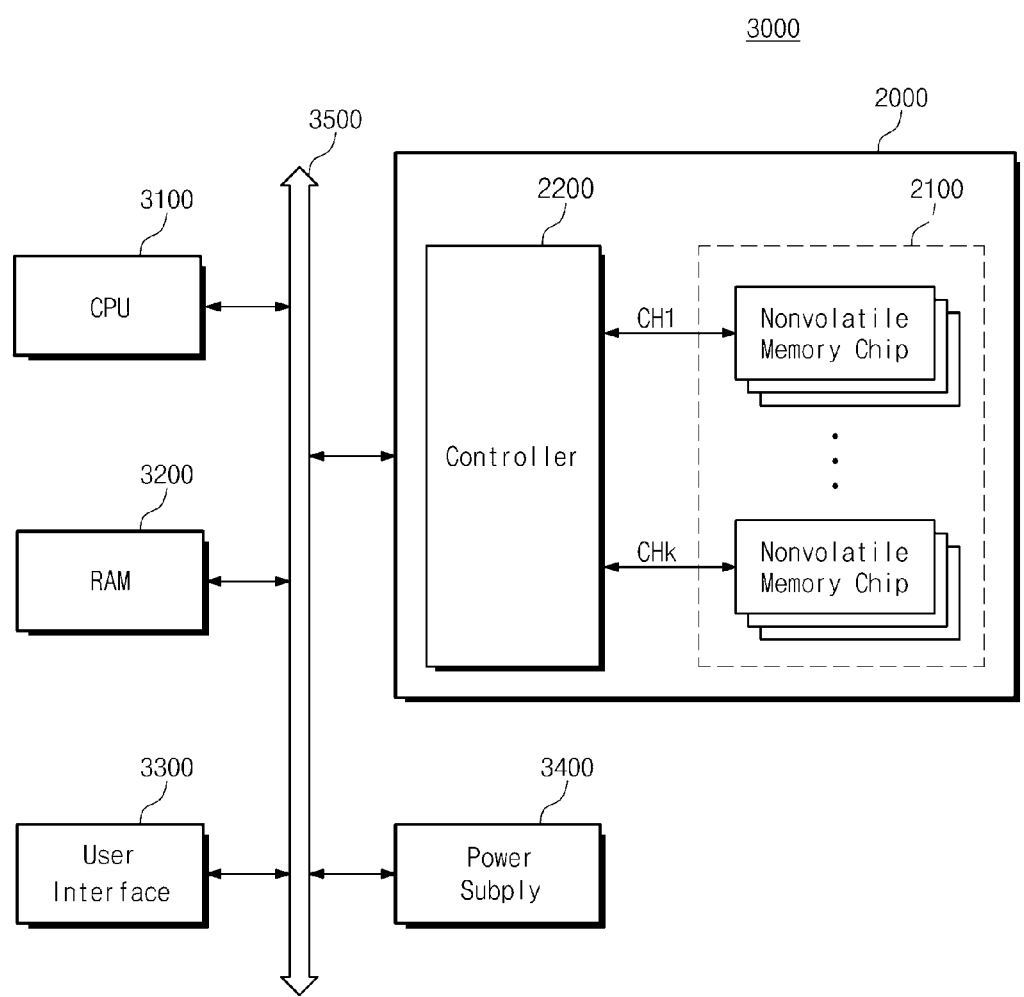
FIG. 36 illustrates a block diagram of a computing system including the memory system described with reference to FIG. 35.

FIG. 36 illustrates a block diagram of a computing system 300 including the memory system 2000 described with reference to FIG. 35. As illustrated, the computing system 3000 may include a central processing unit (CPU) 3100, a random access memory (RAM) 3200, a user interface 3300, a power supply 3400, and a memory system 2000.

The memory system 2000 may be electrically connected to the CPU 3100, the RAM 3200, and the power supply 3400 through a system bus 3500. Data provided through the user interface 3300 or processed by the CPU 3100 may be stored in the memory system 2000.

In FIG. 36, it is illustrated that the nonvolatile memory device 2100 is connected to the system bus 3500 through the controller 2200. However, embodiments are not limited thereto. For example, the nonvolatile memory device 2100 may be configured to be directly connected to the system bus 3500.

In FIG. 36, it is described that the memory system 2000 described with reference to FIG. 33 may be provided in the computing system 3000. However, embodiments are not limited thereto. For example, the memory system 2000 may be replaced with the memory system 1000 described with reference to FIG. 32. The computing system 3000 may be configured to include both the memory systems 1000 and 2000 described with reference to FIGS. 32 and 33.

As described so far, semiconductor nitrides may be provided between conductive materials constituting gates or control gates of memory cell transistors as interlayer dielectrics. Thus, the possibility of spreading caused by a difference in threshold voltage between the memory cell transistors may be reduced to enhance reliability of a nonvolatile memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device, comprising:
a substrate;
a stacked structure including conductive materials and first insulating materials, the conductive materials and the first insulating materials being alternately stacked on the substrate;
a plurality of pillars in contact with the substrate, the pillars extending through the stacked structure in a direction perpendicular to the substrate;
blocking insulating layers between the conductive materials and the first insulating materials; and
second insulating materials between each of the first insulating materials and each of the pillars such that each of the first insulating materials is spaced apart from each of the pillars, each of the second insulating material contacting only one of the first insulating materials,
wherein the first insulating materials consist of silicon nitride.

2. The nonvolatile memory device as claimed in claim 1, wherein the blocking insulating layers extend onto top and bottom surfaces of the conductive materials from between the conductive materials and the pillars.

3. The nonvolatile memory device as claimed in claim 1, further comprising:
tunneling insulating layers on outer side surfaces of the pillars; and
charge trapping layers on outer side surfaces of the tunneling insulating layers,
wherein the blocking insulating layers extend onto top and bottom surfaces of the conductive materials from between the conductive materials and the charge trapping layers.

4. The nonvolatile memory device as claimed in claim 1, wherein each of the pillars includes a silicon layer.

5. A nonvolatile memory device, comprising:
a substrate;
a stacked structure including conductive materials and first insulating materials, the conductive materials and the first insulating materials being alternately stacked on the substrate, and the first insulating materials consisting of silicon nitride;
a plurality of pillars in contact with the substrate, the pillars extending through the stacked structure in a direction perpendicular to the substrate;
second insulating materials between each of the first insulating materials and each of the pillars such that each of the first insulating materials is spaced apart from each of the pillars, each of the second insulating material contacting only one of the first insulating materials;
first silicon oxide layers on outer side surfaces of the pillars, the first silicon oxide layers extending through the stacked structure in the direction perpendicular to the substrate;
charge trapping layers on outer side surfaces of the first silicon oxide layers, the charge trapping layers extending through the stacked structure in the direction perpendicular to the substrate; and
second silicon oxide layers disposed between the conductive materials and the charge trapping layers and extending onto top and bottom surfaces of the conductive materials between the conductive materials and the first insulating materials.

6. The nonvolatile memory device as claimed in claim 5, wherein each of the pillars includes a silicon layer.

7. The nonvolatile memory device as claimed in claim 5, wherein the first insulating materials are in direct contact with the charge trapping layers.

8. A nonvolatile memory device, comprising:
a stacked structure on a substrate, the stacked structure including conductive materials and first insulating materials alternately stacked on the substrate, and the first insulating materials consisting of silicon nitride;
a plurality of pillars in contact with the substrate, the pillars extending through the stacked structure in a direction perpendicular to the substrate;
second insulating materials between each of the first insulating materials and each of the pillars such that each of the first insulating materials is spaced apart from each of the pillars, each of the second insulating material contacting only one of the first insulating materials;
first silicon oxide layers on outer side surfaces of the pillars, the first silicon oxide layers extending through the stacked structure in the direction perpendicular to the substrate;
charge trapping layers on outer side surfaces of the first silicon oxide layers, the charge trapping layers extending through the stacked structure in the direction perpendicular to the substrate; and
second silicon oxide layers disposed between the conductive materials and the charge trapping layers and extending onto top and bottom surfaces of the conductive materials between the conductive materials and the first insulating materials.

9. The nonvolatile memory device as claimed in claim 8, further comprising bitlines connected to the plurality of pillars.

10. The nonvolatile memory device as claimed in claim 1, wherein the second insulating materials include silicon oxide.

* * * * *